(12) United States Patent
Karagozler et al.

(10) Patent No.: US 10,492,302 B2
(45) Date of Patent: Nov. 26, 2019

(54) CONNECTING AN ELECTRONIC COMPONENT TO AN INTERACTIVE TEXTILE

(71) Applicant: Google Inc., Mountain View, CA (US)

(72) Inventors: Mustafa Emre Karagozler, Mountain View, CA (US); Ivan Poupyrev, Sunnyvale, CA (US); Nan-Wei Gong, Cambridge, MA (US); Karen Elizabeth Robinson, Mountain View, CA (US); Patricia Hayes-Danitz, Menlo Park, CA (US); Megan Grant, San Francisco, CA (US)

(73) Assignee: Google LLC, Mountain View, CA (US)

( * ) Notice: Subject to any disclaimer, the term of this patent is extended or adjusted under 35 U.S.C. 154(b) by 312 days.

(21) Appl. No.: 15/352,194

(22) Filed: Nov. 15, 2016

(65) Prior Publication Data
US 2017/0325337 A1 Nov. 9, 2017

Related U.S. Application Data

(60) Provisional application No. 62/331,111, filed on May 3, 2016.

(51) Int. Cl.
*H01R 43/00* (2006.01)
*H05K 3/34* (2006.01)
(Continued)

(52) U.S. Cl.
CPC .............. *H05K 3/34* (2013.01); *A41D 1/005* (2013.01); *D03D 1/0088* (2013.01); *G06F 3/044* (2013.01);
(Continued)

(58) Field of Classification Search
CPC .............. Y10T 156/10; Y10T 442/3854; Y10T 29/49171; D03D 1/0088; H01R 43/28; H05K 1/038
(Continued)

(56) References Cited

U.S. PATENT DOCUMENTS 3,610,874 A 10/1971 Gagliano
3,752,017 A 8/1973 Lloyd et al.
(Continued)

FOREIGN PATENT DOCUMENTS

CN 102031615 4/2011
CN 102160471 8/2011
(Continued)

OTHER PUBLICATIONS

"Final Office Action", U.S. Appl. No. 15/287,308, dated Feb. 8, 2019, 23 pages.
(Continued)

*Primary Examiner* — Thiem D Phan
(74) *Attorney, Agent, or Firm* — Colby Nipper PLLC

(57) ABSTRACT

This document describes techniques and apparatuses for connecting an electronic component to an interactive textile. Loose conductive threads of the interactive textile are collected and organized into a ribbon with a pitch that matches a corresponding pitch of connection points of the electronic component. Next, non-conductive material of the conductive threads of the ribbon are stripped to expose the conductive wires of the conductive threads. After stripping the non-conductive material from the conductive threads of the ribbon, the connection points of the electronic component are bonded to the conductive wires of the ribbon. The conductive threads proximate the ribbon are then sealed using a UV-curable or heat-curable epoxy, and the electronic component and the ribbon are encapsulated to the interactive
(Continued)

textile with a water-resistant material, such as plastic or polymer.

20 Claims, 18 Drawing Sheets

(51) Int. Cl.
  *H03K 17/96* (2006.01)
  *G06F 3/044* (2006.01)
  *A41D 1/00* (2018.01)
  *D03D 1/00* (2006.01)
  *H01R 43/28* (2006.01)
  *H05K 1/03* (2006.01)

(52) U.S. Cl.
  CPC ............ *H01R 43/005* (2013.01); *H01R 43/28* (2013.01); *H03K 17/962* (2013.01); *H05K 1/038* (2013.01); *G06F 2203/04103* (2013.01); *Y10T 29/49171* (2015.01)

(58) Field of Classification Search
  USPC .................. 29/855, 601, 860, 867, 868, 872
  See application file for complete search history.

(56) References Cited

U.S. PATENT DOCUMENTS

| | | | |
|---|---|---|---|
| 3,953,706 | A | 4/1976 | Harris et al. |
| 4,104,012 | A | 8/1978 | Ferrante |
| 4,654,967 | A | 4/1987 | Thenner |
| 4,700,044 | A | 10/1987 | Hokanson et al. |
| 4,795,998 | A | 1/1989 | Dunbar et al. |
| 4,838,797 | A | 6/1989 | Dodier |
| 5,016,500 | A | 5/1991 | Conrad et al. |
| 5,298,715 | A | 3/1994 | Chalco et al. |
| 5,341,979 | A | 8/1994 | Gupta |
| 5,468,917 | A | 11/1995 | Brodsky et al. |
| 5,564,571 | A | 10/1996 | Zanotti |
| 5,656,798 | A | 8/1997 | Kubo et al. |
| 5,724,707 | A | 3/1998 | Kirk et al. |
| 5,798,798 | A | 8/1998 | Rector et al. |
| 6,032,450 | A | 3/2000 | Blum |
| 6,080,690 | A * | 6/2000 | Lebby .................... A41D 31/00 139/420 R |
| 6,101,431 | A | 8/2000 | Niwa et al. |
| 6,210,771 | B1 | 4/2001 | Post et al. |
| 6,313,825 | B1 | 11/2001 | Gilbert |
| 6,340,979 | B1 | 1/2002 | Beaton et al. |
| 6,386,757 | B1 | 5/2002 | Konno |
| 6,440,593 | B2 | 8/2002 | Ellison et al. |
| 6,492,980 | B2 | 12/2002 | Sandbach |
| 6,493,933 | B1 | 12/2002 | Post et al. |
| 6,513,833 | B2 | 2/2003 | Breed et al. |
| 6,513,970 | B1 | 2/2003 | Tabata et al. |
| 6,543,668 | B1 | 4/2003 | Fujii et al. |
| 6,711,354 | B2 | 3/2004 | Kameyama |
| 6,717,065 | B2 | 4/2004 | Hosaka et al. |
| 6,802,720 | B2 | 10/2004 | Weiss et al. |
| 6,833,807 | B2 | 12/2004 | Flacke et al. |
| 6,835,898 | B2 | 12/2004 | Eldridge et al. |
| 6,854,985 | B1 | 2/2005 | Weiss |
| 6,929,484 | B2 | 8/2005 | Weiss et al. |
| 7,019,682 | B1 | 3/2006 | Louberg et al. |
| 7,134,879 | B2 | 11/2006 | Sugimoto et al. |
| 7,158,076 | B2 | 1/2007 | Fiore et al. |
| 7,164,820 | B2 | 1/2007 | Eves et al. |
| 7,205,932 | B2 | 4/2007 | Fiore |
| 7,223,105 | B2 | 5/2007 | Weiss et al. |
| 7,230,610 | B2 | 6/2007 | Jung et al. |
| 7,249,954 | B2 | 7/2007 | Weiss |
| 7,266,532 | B2 | 9/2007 | Sutton et al. |
| 7,299,964 | B2 | 11/2007 | Jayaraman et al. |
| 7,310,236 | B2 | 12/2007 | Takahashi et al. |
| 7,317,416 | B2 | 1/2008 | Flom et al. |
| 7,348,285 | B2 | 3/2008 | Dhawan et al. |
| 7,365,031 | B2 | 4/2008 | Swallow et al. |
| 7,421,061 | B2 | 9/2008 | Boese et al. |
| 7,462,035 | B2 | 12/2008 | Lee et al. |
| 7,528,082 | B2 | 5/2009 | Krans et al. |
| 7,544,627 | B2 | 6/2009 | Tao et al. |
| 7,578,195 | B2 | 8/2009 | DeAngelis et al. |
| 7,644,488 | B2 | 1/2010 | Aisenbrey |
| 7,670,144 | B2 | 3/2010 | Ito et al. |
| 7,677,729 | B2 | 3/2010 | Vilser et al. |
| 7,691,067 | B2 | 4/2010 | Westbrook et al. |
| 7,698,154 | B2 | 4/2010 | Marchosky |
| 7,791,700 | B2 | 9/2010 | Bellamy |
| 7,834,276 | B2 | 11/2010 | Chou et al. |
| 7,845,023 | B2 * | 12/2010 | Swatee .................... C23C 4/04 2/243.1 |
| 7,941,676 | B2 | 5/2011 | Glaser |
| 7,952,512 | B1 | 5/2011 | Delker et al. |
| 8,062,220 | B2 | 11/2011 | Kurtz et al. |
| 8,063,815 | B2 | 11/2011 | Valo et al. |
| 8,169,404 | B1 | 5/2012 | Boillot |
| 8,179,604 | B1 | 5/2012 | Prada Gomez et al. |
| 8,282,232 | B2 | 10/2012 | Hsu et al. |
| 8,289,185 | B2 | 10/2012 | Alonso |
| 8,301,232 | B2 | 10/2012 | Albert et al. |
| 8,314,732 | B2 | 11/2012 | Oswald et al. |
| 8,334,226 | B2 | 12/2012 | Nhan et al. |
| 8,341,762 | B2 | 1/2013 | Balzano |
| 8,344,949 | B2 | 1/2013 | Moshfeghi |
| 8,367,942 | B2 | 2/2013 | Howell et al. |
| 8,475,367 | B1 | 7/2013 | Yuen et al. |
| 8,505,474 | B2 | 8/2013 | Kang et al. |
| 8,514,221 | B2 | 8/2013 | King et al. |
| 8,527,146 | B1 | 9/2013 | Jackson et al. |
| 8,549,829 | B2 | 10/2013 | Song et al. |
| 8,560,972 | B2 | 10/2013 | Wilson |
| 8,569,189 | B2 | 10/2013 | Bhattacharya et al. |
| 8,614,689 | B2 | 12/2013 | Nishikawa et al. |
| 8,700,137 | B2 | 4/2014 | Albert |
| 8,758,020 | B2 | 6/2014 | Burdea et al. |
| 8,759,713 | B2 | 6/2014 | Sheats |
| 8,764,651 | B2 | 7/2014 | Tran |
| 8,785,778 | B2 | 7/2014 | Streeter et al. |
| 8,790,257 | B2 | 7/2014 | Libbus et al. |
| 8,814,574 | B2 | 8/2014 | Selby et al. |
| 8,860,602 | B2 | 10/2014 | Nohara et al. |
| 8,921,473 | B1 | 12/2014 | Hyman |
| 8,948,839 | B1 | 2/2015 | Longinotti-Buitoni et al. |
| 9,055,879 | B2 | 6/2015 | Selby et al. |
| 9,093,289 | B2 | 7/2015 | Vicard et al. |
| 9,125,456 | B2 | 9/2015 | Chow |
| 9,141,194 | B1 | 9/2015 | Keyes et al. |
| 9,148,949 | B2 | 9/2015 | Zhou et al. |
| 9,223,494 | B1 | 12/2015 | Desalvo et al. |
| 9,229,102 | B1 | 1/2016 | Wright et al. |
| 9,230,160 | B1 | 1/2016 | Kanter |
| 9,235,241 | B2 | 1/2016 | Newham et al. |
| 9,316,727 | B2 | 4/2016 | Sentelle et al. |
| 9,331,422 | B2 | 5/2016 | Nazzaro et al. |
| 9,335,825 | B2 | 5/2016 | Rautiainen et al. |
| 9,346,167 | B2 | 5/2016 | O'Connor et al. |
| 9,354,709 | B1 | 5/2016 | Heller et al. |
| 9,569,001 | B2 | 2/2017 | Mistry et al. |
| 9,575,560 | B2 | 2/2017 | Poupyrev et al. |
| 9,588,625 | B2 | 3/2017 | Poupyrev |
| 9,594,443 | B2 | 3/2017 | VanBlon et al. |
| 9,600,080 | B2 | 3/2017 | Poupyrev |
| 9,693,592 | B2 | 7/2017 | Robinson et al. |
| 9,746,551 | B2 | 8/2017 | Scholten et al. |
| 9,766,742 | B2 | 9/2017 | Papakostas |
| 9,778,749 | B2 | 10/2017 | Poupyrev |
| 9,811,164 | B2 | 11/2017 | Poupyrev |
| 9,817,109 | B2 | 11/2017 | Saboo et al. |
| 9,837,760 | B2 | 12/2017 | Karagozler et al. |
| 9,921,660 | B2 | 3/2018 | Poupyrev |
| 9,933,908 | B2 | 4/2018 | Poupyrev |
| 9,947,080 | B2 | 4/2018 | Nguyen et al. |
| 9,971,414 | B2 | 5/2018 | Gollakota et al. |
| 9,971,415 | B2 | 5/2018 | Poupyrev et al. |

(56) References Cited

U.S. PATENT DOCUMENTS

| | | |
|---|---|---|
| 9,983,747 B2 | 5/2018 | Poupyrev |
| 9,994,233 B2 | 6/2018 | Diaz-Jimenez et al. |
| 10,034,630 B2 | 7/2018 | Lee et al. |
| 10,073,590 B2 | 9/2018 | Dascola et al. |
| 10,082,950 B2 | 9/2018 | Lapp |
| 10,088,908 B1 | 10/2018 | Poupyrev et al. |
| 10,139,916 B2 | 11/2018 | Poupyrev |
| 10,155,274 B2 | 12/2018 | Robinson et al. |
| 10,175,781 B2 | 1/2019 | Karagozler et al. |
| 10,203,763 B1 | 2/2019 | Poupyrev et al. |
| 10,222,469 B1 | 3/2019 | Gillian et al. |
| 10,241,581 B2 | 3/2019 | Lien et al. |
| 10,268,321 B2 | 4/2019 | Poupyrev |
| 10,285,456 B2 | 5/2019 | Poupyrev et al. |
| 10,300,370 B1 | 5/2019 | Amihood et al. |
| 10,310,620 B2 | 6/2019 | Lien et al. |
| 10,310,621 B1 | 6/2019 | Lien et al. |
| 10,379,621 B2 | 8/2019 | Schwesig et al. |
| 10,401,490 B2 | 9/2019 | Gillian et al. |
| 10,409,385 B2 | 9/2019 | Poupyrev |
| 2001/0035836 A1 | 11/2001 | Miceli et al. |
| 2002/0009972 A1 | 1/2002 | Amento et al. |
| 2002/0080156 A1 | 6/2002 | Abbott et al. |
| 2002/0170897 A1 | 11/2002 | Hall |
| 2003/0005030 A1 | 1/2003 | Sutton et al. |
| 2003/0100228 A1 | 5/2003 | Bungo et al. |
| 2003/0119391 A1 | 6/2003 | Swallow et al. |
| 2004/0009729 A1 | 1/2004 | Hill et al. |
| 2004/0259391 A1 | 12/2004 | Jung et al. |
| 2005/0069695 A1 | 3/2005 | Jung et al. |
| 2005/0128124 A1 | 6/2005 | Greneker et al. |
| 2005/0148876 A1 | 7/2005 | Endoh et al. |
| 2005/0231419 A1 | 10/2005 | Mitchell |
| 2005/0267366 A1 | 12/2005 | Murashita et al. |
| 2006/0035554 A1 | 2/2006 | Glaser et al. |
| 2006/0040739 A1 | 2/2006 | Wells |
| 2006/0047386 A1 | 3/2006 | Kanevsky et al. |
| 2006/0061504 A1 | 3/2006 | Leach, Jr. et al. |
| 2006/0125803 A1 | 6/2006 | Westerman et al. |
| 2006/0136997 A1 | 6/2006 | Telek et al. |
| 2006/0139162 A1 | 6/2006 | Flynn |
| 2006/0148351 A1 | 7/2006 | Tao et al. |
| 2006/0157734 A1 | 7/2006 | Onodero et al. |
| 2006/0166620 A1 | 7/2006 | Sorensen |
| 2006/0170584 A1 | 8/2006 | Romero et al. |
| 2006/0209021 A1 | 9/2006 | Yoo et al. |
| 2006/0258205 A1 | 11/2006 | Locher et al. |
| 2006/0284757 A1 | 12/2006 | Zemany |
| 2007/0024488 A1 | 2/2007 | Zemany et al. |
| 2007/0026695 A1 | 2/2007 | Lee et al. |
| 2007/0027369 A1 | 2/2007 | Pagnacco et al. |
| 2007/0118043 A1 | 5/2007 | Oliver et al. |
| 2007/0161921 A1 | 7/2007 | Rausch |
| 2007/0176821 A1 | 8/2007 | Flom et al. |
| 2007/0192647 A1 | 8/2007 | Glaser |
| 2007/0197115 A1 | 8/2007 | Eves et al. |
| 2007/0197878 A1 | 8/2007 | Shklarski |
| 2007/0210074 A1 | 9/2007 | Maurer et al. |
| 2007/0237423 A1 | 10/2007 | Tico et al. |
| 2008/0002027 A1 | 1/2008 | Kondo et al. |
| 2008/0024438 A1 | 1/2008 | Collins et al. |
| 2008/0065291 A1 | 3/2008 | Breed |
| 2008/0134102 A1 | 6/2008 | Movold et al. |
| 2008/0136775 A1 | 6/2008 | Conant |
| 2008/0168396 A1 | 7/2008 | Matas et al. |
| 2008/0194204 A1 | 8/2008 | Duet et al. |
| 2008/0211766 A1 | 9/2008 | Westerman et al. |
| 2008/0233822 A1 | 9/2008 | Swallow et al. |
| 2008/0282665 A1 | 11/2008 | Speleers |
| 2008/0291158 A1 | 11/2008 | Park et al. |
| 2008/0303800 A1 | 12/2008 | Elwell |
| 2008/0316085 A1 | 12/2008 | Rofougaran et al. |
| 2008/0320419 A1 | 12/2008 | Matas et al. |
| 2009/0018428 A1 | 1/2009 | Dias et al. |
| 2009/0033585 A1 | 2/2009 | Lang |
| 2009/0053950 A1 | 2/2009 | Surve |
| 2009/0056300 A1 | 3/2009 | Chung et al. |
| 2009/0058820 A1 | 3/2009 | Hinckley |
| 2009/0113298 A1 | 4/2009 | Jung et al. |
| 2009/0115617 A1 | 5/2009 | Sano et al. |
| 2009/0118648 A1 | 5/2009 | Kandori et al. |
| 2009/0149036 A1 | 6/2009 | Lee et al. |
| 2009/0177068 A1 | 7/2009 | Stivoric et al. |
| 2009/0203244 A1 | 8/2009 | Toonder |
| 2009/0226043 A1 | 9/2009 | Angell et al. |
| 2009/0270690 A1 | 10/2009 | Roos et al. |
| 2009/0278915 A1 | 11/2009 | Kramer et al. |
| 2009/0288762 A1 | 11/2009 | Wolfel |
| 2009/0295712 A1 | 12/2009 | Ritzau |
| 2009/0319181 A1 | 12/2009 | Khosravy et al. |
| 2010/0050133 A1 | 2/2010 | Nishihara et al. |
| 2010/0053151 A1 | 3/2010 | Marti et al. |
| 2010/0065320 A1 | 3/2010 | Urano |
| 2010/0071205 A1 | 3/2010 | Graumann et al. |
| 2010/0094141 A1 | 4/2010 | Puswella |
| 2010/0109938 A1 | 5/2010 | Oswald et al. |
| 2010/0152600 A1 | 6/2010 | Droitcour et al. |
| 2010/0198067 A1 | 8/2010 | Mahfouz et al. |
| 2010/0201586 A1 | 8/2010 | Michalk |
| 2010/0205667 A1 | 8/2010 | Anderson et al. |
| 2010/0208035 A1 | 8/2010 | Pinault et al. |
| 2010/0225562 A1 | 9/2010 | Smith |
| 2010/0234094 A1 | 9/2010 | Gagner et al. |
| 2010/0241009 A1 | 9/2010 | Petkie |
| 2010/0002912 A1 | 10/2010 | Solinsky |
| 2010/0281438 A1 | 11/2010 | Latta et al. |
| 2010/0306713 A1 | 12/2010 | Geisner et al. |
| 2010/0313414 A1 | 12/2010 | Sheats |
| 2010/0325770 A1 | 12/2010 | Chung et al. |
| 2011/0003664 A1 | 1/2011 | Richard |
| 2011/0010014 A1 | 1/2011 | Oexman et al. |
| 2011/0073353 A1 | 3/2011 | Lee et al. |
| 2011/0083111 A1 | 4/2011 | Forutanpour et al. |
| 2011/0093820 A1 | 4/2011 | Zhang et al. |
| 2011/0166940 A1 | 7/2011 | Bangera et al. |
| 2011/0181509 A1 | 7/2011 | Rautiainen et al. |
| 2011/0181510 A1 | 7/2011 | Hakala et al. |
| 2011/0197263 A1 | 8/2011 | Stinson, III |
| 2011/0213218 A1 | 9/2011 | Weiner et al. |
| 2011/0221666 A1 | 9/2011 | Newton et al. |
| 2011/0234492 A1 | 9/2011 | Ajmera et al. |
| 2011/0279303 A1 | 11/2011 | Smith |
| 2011/0286585 A1 | 11/2011 | Hodge |
| 2011/0303341 A1 | 12/2011 | Meiss et al. |
| 2011/0307842 A1 | 12/2011 | Chiang et al. |
| 2011/0316888 A1 | 12/2011 | Sachs et al. |
| 2011/0318985 A1 | 12/2011 | McDermid |
| 2012/0001875 A1 | 1/2012 | Li et al. |
| 2012/0019168 A1 | 1/2012 | Noda et al. |
| 2012/0047468 A1 | 2/2012 | Santos et al. |
| 2012/0068876 A1 | 3/2012 | Bangera et al. |
| 2012/0092284 A1 | 4/2012 | Rofougaran et al. |
| 2012/0123232 A1 | 5/2012 | Najarian et al. |
| 2012/0127082 A1 | 5/2012 | Kushler et al. |
| 2012/0144934 A1 | 6/2012 | Russell et al. |
| 2012/0150493 A1 | 6/2012 | Casey et al. |
| 2012/0154313 A1 | 6/2012 | Au et al. |
| 2012/0156926 A1 | 6/2012 | Kato et al. |
| 2012/0174299 A1 | 7/2012 | Balzano |
| 2012/0174736 A1 | 7/2012 | Wang et al. |
| 2012/0182222 A1 | 7/2012 | Moloney |
| 2012/0193801 A1 | 8/2012 | Gross et al. |
| 2012/0248093 A1 | 10/2012 | Ulrich et al. |
| 2012/0254810 A1 | 10/2012 | Heck et al. |
| 2012/0268416 A1 | 10/2012 | Pirogov et al. |
| 2012/0280900 A1 | 11/2012 | Wang et al. |
| 2012/0298748 A1 | 11/2012 | Factor et al. |
| 2012/0310665 A1 | 12/2012 | Xu et al. |
| 2013/0016070 A1 | 1/2013 | Starner et al. |
| 2013/0027218 A1 | 1/2013 | Schwarz et al. |
| 2013/0046544 A1 | 2/2013 | Kay et al. |
| 2013/0053653 A1 | 2/2013 | Cuddihy et al. |
| 2013/0078624 A1 | 3/2013 | Holmes et al. |
| 2013/0082922 A1 | 4/2013 | Miller |

(56) References Cited

U.S. PATENT DOCUMENTS

| | | |
|---|---|---|
| 2013/0083173 A1 | 4/2013 | Geisner et al. |
| 2013/0102217 A1 | 4/2013 | Jeon |
| 2013/0104084 A1 | 4/2013 | Mlyniec et al. |
| 2013/0113647 A1 | 5/2013 | Sentelle et al. |
| 2013/0117377 A1 | 5/2013 | Miller |
| 2013/0132931 A1 | 5/2013 | Bruns et al. |
| 2013/0147833 A1 | 6/2013 | Aubauer et al. |
| 2013/0150735 A1 | 6/2013 | Cheng |
| 2013/0161078 A1 | 6/2013 | Li |
| 2013/0169471 A1 | 7/2013 | Lynch |
| 2013/0176161 A1 | 7/2013 | Derham et al. |
| 2013/0194173 A1 | 8/2013 | Zhu et al. |
| 2013/0195330 A1 | 8/2013 | Kim et al. |
| 2013/0196716 A1 | 8/2013 | Muhammad |
| 2013/0207962 A1 | 8/2013 | Oberdorfer et al. |
| 2013/0241765 A1 | 9/2013 | Kozma et al. |
| 2013/0245986 A1 | 9/2013 | Grokop et al. |
| 2013/0253029 A1 | 9/2013 | Jain et al. |
| 2013/0260630 A1* | 10/2013 | Ito .......................... D03D 1/00 442/205 |
| 2013/0278499 A1 | 10/2013 | Anderson |
| 2013/0278501 A1 | 10/2013 | Bulzacki |
| 2013/0332438 A1 | 12/2013 | Li et al. |
| 2013/0345569 A1 | 12/2013 | Mestha et al. |
| 2014/0005809 A1 | 1/2014 | Frei et al. |
| 2014/0022108 A1 | 1/2014 | Alberth et al. |
| 2014/0028539 A1 | 1/2014 | Newham et al. |
| 2014/0049487 A1 | 2/2014 | Konertz et al. |
| 2014/0050354 A1 | 2/2014 | Heim et al. |
| 2014/0070957 A1 | 3/2014 | Longinotti-Buitoni et al. |
| 2014/0073969 A1 | 3/2014 | Zou et al. |
| 2014/0081100 A1 | 3/2014 | Muhsin et al. |
| 2014/0095480 A1 | 4/2014 | Marantz et al. |
| 2014/0097979 A1 | 4/2014 | Nohara et al. |
| 2014/0121540 A1 | 5/2014 | Raskin |
| 2014/0135631 A1 | 5/2014 | Brumback et al. |
| 2014/0139422 A1 | 5/2014 | Mistry et al. |
| 2014/0139616 A1 | 5/2014 | Pinter et al. |
| 2014/0143678 A1 | 5/2014 | Mistry et al. |
| 2014/0184496 A1 | 7/2014 | Gribetz et al. |
| 2014/0184499 A1 | 7/2014 | Kim |
| 2014/0191939 A1 | 7/2014 | Penn et al. |
| 2014/0200416 A1 | 7/2014 | Kashef et al. |
| 2014/0201690 A1 | 7/2014 | Holz |
| 2014/0208275 A1 | 7/2014 | Mongia et al. |
| 2014/0215389 A1 | 7/2014 | Walsh et al. |
| 2014/0239065 A1 | 8/2014 | Zhou et al. |
| 2014/0244277 A1 | 8/2014 | Krishna Rao et al. |
| 2014/0246415 A1 | 9/2014 | Wittkowski |
| 2014/0247212 A1 | 9/2014 | Kim et al. |
| 2014/0250515 A1 | 9/2014 | Jakobsson |
| 2014/0253431 A1 | 9/2014 | Gossweiler et al. |
| 2014/0253709 A1 | 9/2014 | Bresch et al. |
| 2014/0262478 A1 | 9/2014 | Harris et al. |
| 2014/0280295 A1 | 9/2014 | Kurochikin et al. |
| 2014/0281975 A1 | 9/2014 | Anderson |
| 2014/0282877 A1 | 9/2014 | Mahaffey et al. |
| 2014/0297006 A1 | 10/2014 | Sadhu |
| 2014/0298266 A1 | 10/2014 | Lapp |
| 2014/0300506 A1 | 10/2014 | Alton et al. |
| 2014/0306936 A1 | 10/2014 | Dahl et al. |
| 2014/0309855 A1 | 10/2014 | Tran |
| 2014/0316261 A1 | 10/2014 | Lux et al. |
| 2014/0318699 A1 | 10/2014 | Longinotti-Buitoni et al. |
| 2014/0324888 A1 | 10/2014 | Xie et al. |
| 2014/0329567 A1 | 11/2014 | Chan et al. |
| 2014/0333467 A1 | 11/2014 | Inomata |
| 2014/0343392 A1 | 11/2014 | Yang |
| 2014/0347295 A1 | 11/2014 | Kim et al. |
| 2014/0357369 A1 | 12/2014 | Callens et al. |
| 2014/0368441 A1 | 12/2014 | Touloumtzis |
| 2015/0002391 A1 | 1/2015 | Chen |
| 2015/0009096 A1 | 1/2015 | Lee et al. |
| 2015/0029050 A1 | 1/2015 | Driscoll et al. |
| 2015/0030256 A1 | 1/2015 | Brady et al. |
| 2015/0040040 A1 | 2/2015 | Balan et al. |
| 2015/0062033 A1 | 3/2015 | Ishihara |
| 2015/0068069 A1 | 3/2015 | Tran et al. |
| 2015/0077282 A1 | 3/2015 | Mohamadi |
| 2015/0085060 A1 | 3/2015 | Fish et al. |
| 2015/0091820 A1 | 4/2015 | Rosenberg et al. |
| 2015/0091858 A1 | 4/2015 | Rosenberg et al. |
| 2015/0091859 A1 | 4/2015 | Rosenberg et al. |
| 2015/0095987 A1 | 4/2015 | Potash et al. |
| 2015/0106770 A1 | 4/2015 | Shah et al. |
| 2015/0109164 A1 | 4/2015 | Takaki |
| 2015/0112606 A1 | 4/2015 | He et al. |
| 2015/0133017 A1 | 5/2015 | Liao et al. |
| 2015/0143601 A1 | 5/2015 | Longinotti-Buitoni et al. |
| 2015/0145805 A1 | 5/2015 | Liu |
| 2015/0162729 A1 | 6/2015 | Reversat et al. |
| 2015/0177866 A1 | 6/2015 | Hwang et al. |
| 2015/0185314 A1 | 7/2015 | Corcos et al. |
| 2015/0199045 A1 | 7/2015 | Robucci et al. |
| 2015/0223733 A1 | 8/2015 | Al-Alusi |
| 2015/0226004 A1 | 8/2015 | Thompson |
| 2015/0229885 A1 | 8/2015 | Offenhaeuser |
| 2015/0256763 A1 | 9/2015 | Niemi |
| 2015/0261320 A1 | 9/2015 | Leto |
| 2015/0268027 A1 | 9/2015 | Gerdes |
| 2015/0268799 A1 | 9/2015 | Starner et al. |
| 2015/0277569 A1 | 10/2015 | Sprenger et al. |
| 2015/0280102 A1 | 10/2015 | Tajitsu et al. |
| 2015/0285906 A1 | 10/2015 | Hooper et al. |
| 2015/0312041 A1 | 10/2015 | Choi |
| 2015/0314780 A1 | 11/2015 | Stenneth et al. |
| 2015/0317518 A1 | 11/2015 | Fujimaki et al. |
| 2015/0323993 A1 | 11/2015 | Levesque et al. |
| 2015/0332075 A1 | 11/2015 | Burch |
| 2015/0341550 A1 | 11/2015 | Lay |
| 2015/0346820 A1 | 12/2015 | Poupyrev et al. |
| 2015/0350902 A1 | 12/2015 | Baxley et al. |
| 2015/0375339 A1 | 12/2015 | Sterling et al. |
| 2016/0018948 A1 | 1/2016 | Parvarandeh et al. |
| 2016/0026253 A1 | 1/2016 | Bradski et al. |
| 2016/0038083 A1 | 2/2016 | Ding et al. |
| 2016/0041617 A1 | 2/2016 | Poupyrev |
| 2016/0041618 A1 | 2/2016 | Poupyrev |
| 2016/0042169 A1 | 2/2016 | Polehn |
| 2016/0048235 A1 | 2/2016 | Poupyrev |
| 2016/0048236 A1 | 2/2016 | Poupyrev |
| 2016/0048672 A1 | 2/2016 | Lux et al. |
| 2016/0054792 A1 | 2/2016 | Poupyrev |
| 2016/0054803 A1 | 2/2016 | Poupyrev |
| 2016/0054804 A1 | 2/2016 | Gollakata et al. |
| 2016/0055201 A1 | 2/2016 | Poupyrev et al. |
| 2016/0090839 A1 | 3/2016 | Stolarcyzk |
| 2016/0098089 A1 | 4/2016 | Poupyrev |
| 2016/0100166 A1 | 4/2016 | Dragne et al. |
| 2016/0103500 A1 | 4/2016 | Hussey et al. |
| 2016/0106328 A1 | 4/2016 | Mestha et al. |
| 2016/0131741 A1 | 5/2016 | Park |
| 2016/0140872 A1 | 5/2016 | Palmer et al. |
| 2016/0145776 A1 | 5/2016 | Roh |
| 2016/0146931 A1 | 5/2016 | Rao et al. |
| 2016/0170491 A1 | 6/2016 | Jung |
| 2016/0171293 A1 | 6/2016 | Li et al. |
| 2016/0186366 A1 | 6/2016 | McMaster |
| 2016/0216825 A1 | 7/2016 | Forutanpour |
| 2016/0249698 A1 | 9/2016 | Berzowska et al. |
| 2016/0252607 A1 | 9/2016 | Saboo et al. |
| 2016/0253044 A1 | 9/2016 | Katz |
| 2016/0259037 A1 | 9/2016 | Molchanov et al. |
| 2016/0262685 A1 | 9/2016 | Wagner et al. |
| 2016/0282988 A1 | 9/2016 | Poupyrev |
| 2016/0283101 A1 | 9/2016 | Schwesig et al. |
| 2016/0284436 A1 | 9/2016 | Fukuhara et al. |
| 2016/0299526 A1 | 10/2016 | Inagaki et al. |
| 2016/0320852 A1 | 11/2016 | Poupyrev |
| 2016/0320853 A1 | 11/2016 | Lien et al. |
| 2016/0320854 A1 | 11/2016 | Lien et al. |
| 2016/0321428 A1 | 11/2016 | Rogers |
| 2016/0345638 A1 | 12/2016 | Robinson et al. |
| 2016/0349790 A1 | 12/2016 | Connor |

(56) References Cited

U.S. PATENT DOCUMENTS

| | | |
|---|---|---|
| 2016/0349845 A1 | 12/2016 | Poupyrev et al. |
| 2016/0377712 A1 | 12/2016 | Wu et al. |
| 2017/0029985 A1 | 2/2017 | Tajitsu et al. |
| 2017/0052618 A1 | 2/2017 | Lee et al. |
| 2017/0060254 A1 | 3/2017 | Molchanov et al. |
| 2017/0060298 A1 | 3/2017 | Hwang et al. |
| 2017/0075481 A1 | 3/2017 | Chou et al. |
| 2017/0075496 A1 | 3/2017 | Rosenberg et al. |
| 2017/0097413 A1 | 4/2017 | Gillian et al. |
| 2017/0097684 A1 | 4/2017 | Lien |
| 2017/0115777 A1 | 4/2017 | Poupyrev |
| 2017/0124407 A1 | 5/2017 | Micks et al. |
| 2017/0125940 A1 | 5/2017 | Karagozler et al. |
| 2017/0192523 A1 | 7/2017 | Poupyrev |
| 2017/0196513 A1 | 7/2017 | Longinotti-Buitoni et al. |
| 2017/0232538 A1 | 8/2017 | Robinson et al. |
| 2017/0233903 A1 | 8/2017 | Jeon |
| 2017/0249033 A1 | 8/2017 | Podhajny et al. |
| 2017/0322633 A1 | 11/2017 | Shen et al. |
| 2017/0325518 A1 | 11/2017 | Poupyrev et al. |
| 2017/0329425 A1 | 11/2017 | Karagozler et al. |
| 2018/0004301 A1 | 1/2018 | Poupyrev |
| 2018/0005766 A1 | 1/2018 | Fairbanks et al. |
| 2018/0046258 A1 | 2/2018 | Poupyrev |
| 2018/0095541 A1 | 4/2018 | Gribetz et al. |
| 2018/0106897 A1 | 4/2018 | Shouldice et al. |
| 2018/0113032 A1 | 4/2018 | Dickey et al. |
| 2018/0157330 A1 | 6/2018 | Gu et al. |
| 2018/0160943 A1 | 6/2018 | Fyfe et al. |
| 2018/0196527 A1 | 7/2018 | Poupyrev et al. |
| 2018/0321841 A1 | 11/2018 | Lapp |
| 2019/0033981 A1 | 1/2019 | Poupyrev |
| 2019/0138109 A1 | 5/2019 | Poupyrev et al. |
| 2019/0155396 A1 | 5/2019 | Lien et al. |
| 2019/0208837 A1 | 7/2019 | Poupyrev et al. |
| 2019/0232156 A1 | 8/2019 | Amihood et al. |
| 2019/0243464 A1 | 8/2019 | Lien et al. |
| 2019/0257939 A1 | 8/2019 | Schwesig et al. |

FOREIGN PATENT DOCUMENTS

| | | |
|---|---|---|
| CN | 202887794 | 4/2013 |
| CN | 103907405 | 7/2014 |
| CN | 103355860 | 1/2016 |
| DE | 102011075725 | 11/2012 |
| DE | 102013201359 | 7/2014 |
| EP | 0161895 | 11/1985 |
| EP | 1815788 | 8/2007 |
| GB | 2070469 | 9/1981 |
| GB | 2443208 | 4/2008 |
| JP | 2003280049 | 10/2003 |
| JP | 2006234716 | 9/2006 |
| JP | 2011102457 | 5/2011 |
| WO | WO-0130123 | 4/2001 |
| WO | WO-2001027855 | 4/2001 |
| WO | WO-0175778 | 10/2001 |
| WO | WO-2002082999 | 10/2002 |
| WO | WO-2005033387 | 4/2005 |
| WO | 2007125298 | 11/2007 |
| WO | WO-2008061385 | 5/2008 |
| WO | WO-2009032073 | 3/2009 |
| WO | 2009083467 | 7/2009 |
| WO | WO-2010032173 | 3/2010 |
| WO | WO-2012026013 | 3/2012 |
| WO | WO-2012152476 | 11/2012 |
| WO | WO-2013082806 | 6/2013 |
| WO | WO-2013084108 | 6/2013 |
| WO | WO-2013186696 | 12/2013 |
| WO | WO-2013191657 | 12/2013 |
| WO | WO-2014019085 | 2/2014 |
| WO | WO-2014116968 | 7/2014 |
| WO | WO-2014136027 | 9/2014 |
| WO | WO-2014138280 | 9/2014 |
| WO | WO-2014160893 | 10/2014 |
| WO | WO-2014165476 | 10/2014 |
| WO | WO-2014204323 | 12/2014 |
| WO | WO-2015017931 | 2/2015 |
| WO | WO-2015022671 | 2/2015 |
| WO | 2016053624 | 4/2016 |
| WO | 20170200949 | 11/2017 |
| WO | 2018106306 | 6/2018 |

OTHER PUBLICATIONS

"Final Office Action", U.S. Appl. No. 15/287,253, dated Apr. 2, 2019, 10 pages.
"Non-Final Office Action", U.S. Appl. No. 15/166,198, dated Feb. 21, 2019, 48 pages.
"Non-Final Office Action", U.S. Appl. No. 15/287,394, dated Mar. 22, 2019, 39 pages.
"Non-Final Office Action", U.S. Appl. No. 16/238,464, dated Mar. 7, 2019, 15 pages.
"Notice of Allowance", U.S. Appl. No. 15/286,495, dated Jan. 17, 2019, 5 pages.
"Notice of Allowance", U.S. Appl. No. 15/142,829, dated Feb. 6, 2019, 8 pages.
"Notice of Allowance", U.S. Appl. No. 14/504,137, Feb. 6, 2019, 9 pages.
"Notice of Allowance", U.S. Appl. No. 15/286,152, dated Mar. 5, 2019, 23 pages.
"Notice of Allowance", U.S. Appl. No. 15/286,837, dated Mar. 6, 2019, 7 pages.
"Notice of Allowance", U.S. Appl. No. 15/286,512, dated Apr. 9, 2019, 14 pages.
"Pre-Interview Communication", U.S. Appl. No. 15/703,511, dated Feb. 11, 2019, 5 pages.
Garmatyuk, et al., "Ultra-Wideband Continuous-Wave Random Noise Arc-SAR", IEEE Transaction on Geoscience and Remote Sensing, vol. 40, No. 12, Dec. 2002, Dec. 2002, 10 pages.
Geisheimer, et al., "A Continuous-Wave (CW) Radar for Gait Analysis", IEEE 2001, 2001, 5 pages.
"Final Office Action", U.S. Appl. No. 14/518,863, dated Apr. 4, 2018, 21 pages.
"Final Office Action", U.S. Appl. No. 14/504,139, dated May 1, 2018, 14 pages.
"Final Office Action", U.S. Appl. No. 15/595,649, dated May 23, 2018, 13 pages.
"Final Office Action", U.S. Appl. No. 15/142,689, dated Jun. 1, 2018, 16 pages.
"Final Office Action", U.S. Appl. No. 14/874,955, dated Jun. 11, 2018, 9 pages.
"Final Office Action", U.S. Appl. No. 14/959,901, dated Jun. 15, 2018, 21 pages.
"Final Office Action", U.S. Appl. No. 15/286,152, dated Jun. 26, 2018, 25 pages.
"Final Office Action", U.S. Appl. No. 15/267,181, dated Jun. 7, 2018, 31 pages.
"First Action Interview Office Action", U.S. Appl. No. 15/166,198, dated Apr. 25, 2018, 8 pages.
"Foreign Office Action", Chinese Application No. 201721290290.3, dated Jun. 6, 2018, 3 pages.
"Non-Final Office Action", U.S. Appl. No. 15/287,253, dated Apr. 5, 2018, 17 pages.
"Non-Final Office Action", U.S. Appl. No. 15/586,174, dated Jun. 18, 2018, 7 pages.
"Notice of Allowance", U.S. Appl. No. 14/862,409, dated Jun. 6, 2018, 7 pages.
"Pre-Interview Communication", U.S. Appl. No. 15/362,359, dated May 17, 2018, 4 pages.
"Written Opinion", PCT Application No. PCT/US2017/032733, dated Jul. 24, 2017, 5 pages.
"Cardiio", Retrieved From: <http://www.cardiio.com/> Apr. 15, 2015 App Information Retrieved From: <https://itunes.apple.com/us/app/cardiio-touchless-camera-pulse/id542891434?ls=1&mt=8> Apr. 15, 2015, Feb. 24, 2015, 6 pages.
"Corrected Notice of Allowance", U.S. Appl. No. 14/312,486, dated Oct. 28, 2016, 4 pages.

(56) References Cited

OTHER PUBLICATIONS

"Extended European Search Report", EP Application No. 15170577.9, dated Nov. 5, 2015, 12 pages.
"Final Office Action", U.S. Appl. No. 14/312,486, dated Jun. 3, 2016, 32 pages.
"Final Office Action", U.S. Appl. No. 14/504,038, dated Sep. 27, 2016, 23 pages.
"Final Office Action", U.S. Appl. No. 14/504,061, dated Mar. 9, 2016, 10 pages.
"Frogpad Introduces Wearable Fabric Keyboard with Bluetooth Technology", Retrieved From: <http://www.geekzone.co.nz/content.asp?contentid=3898> Mar. 16, 2015, Jan. 7, 2005, 2 pages.
"International Search Report and Written Opinion", Application No. PCT/US2015/044774, dated Nov. 3, 2015, 12 pages.
"International Search Report and Written Opinion", Application No. PCT/US2016/024267, dated Jun. 20, 2016, 13 pages.
"International Search Report and Written Opinion", Application No. PCT/US2016/024273, dated Jun. 20, 2016, 13 pages.
"International Search Report and Written Opinion", Application No. PCT/US2016/032307, dated Aug. 25, 2016, 13 pages.
"International Search Report and Written Opinion", Application No. PCT/US2016/029820, dated Jul. 15, 2016, 14 pages.
"International Search Report and Written Opinion", Application No. PCT/US2016/030177, dated Aug. 2, 2016, 15 pages.
"International Search Report and Written Opinion", Application No. PCT/US2015/043963, dated Nov. 24, 2015, 16 pages.
"International Search Report and Written Opinion", Application No. PCT/US2015/050903, dated Feb. 19, 2016, 18 pages.
"International Search Report and Written Opinion", Application No. PCT/US2016/030115, dated Aug. 8, 2016, 18 pages.
"International Search Report and Written Opinion", Application No. PCT/US2015/043949, dated Dec. 1, 2015, 18 pages.
"Non-Final Office Action", U.S. Appl. No. 14/312,486, dated Oct. 23, 2015, 25 pages.
"Non-Final Office Action", U.S. Appl. No. 14/504,038, dated Feb. 26, 2016, 22 pages.
"Non-Final Office Action", U.S. Appl. No. 14/504,061, dated Nov. 4, 2015, 8 pages.
"Non-Final Office Action", U.S. Appl. No. 14/518,863, dated Oct. 14, 2016, 16 pages.
"Non-Final Office Action", U.S. Appl. No. 14/582,896, dated Jun. 29, 2016, 9 pages.
"Non-Final Office Action", U.S. Appl. No. 14/666,155, dated Aug. 24, 2016, 9 pages.
"Non-Final Office Action", U.S. Appl. No. 14/681,625, dated Aug. 12, 2016, 9 pages.
"Non-Final Office Action", U.S. Appl. No. 14/930,220, dated Sep. 14, 2016, 15 pages.
"Notice of Allowance", U.S. Appl. No. 14/312,486, dated Oct. 7, 2016, 15 pages.
"Notice of Allowance", U.S. Appl. No. 14/504,061, dated Sep. 12, 2016, 7 pages.
"Notice of Allowance", U.S. Appl. No. 14/582,896, dated Nov. 7, 2016, 5 pages.
"Philips Vital Signs Camera", Retrieved From: <http://www.vitalsignscamera.com/> Apr. 15, 2015, Jul. 17, 2013, 2 pages.
"Pre-Interview Communication", U.S. Appl. No. 14/513,875, dated Oct. 21, 2016, 3 pages.
"Restriction Requirement", U.S. Appl. No. 14/666,155, dated Jul. 22, 2016, 5 pages.
"The Instant Blood Pressure app estimates blood pressure with your smartphone and our algorithm", Retrieved at: http://www.instantbloodpressure.com/—on Jun. 23, 2016, 6 pages.
Arbabian,"A 94GHz mm-Wave to Baseband Pulsed-Radar for Imaging and Gesture Recognition", 2012 IEEE, 2012 Symposium on VLSI Circuits Digest of Technical Papers, 2012, 2 pages.
Balakrishnan,"Detecting Pulse from Head Motions in Video", In Proceedings: CVPR '13 Proceedings of the 2013 IEEE Conference on Computer Vision and Pattern Recognition Available at: <http://people.csail.mit.edu/mrub/vidmag/papers/Balakrishnan_Detecting_Pulse_from_2013_CVPR_paper.pdf>, Jun. 23, 2013, 8 pages.
Couderc,"Detection of Atrial Fibrillation using Contactless Facial Video Monitoring", In Proceedings: Heart Rhythm Society, vol. 12, Issue 1 Available at: <http://www.heartrhythmjournal.com/article/S1547-5271(14)00924-2/pdf>, Jan. 2015, 7 pages.
Espina,"Wireless Body Sensor Network for Continuous Cuff-less Blood Pressure Monitoring", International Summer School on Medical Devices and Biosensors, 2006, Sep. 2006, 5 pages.
Godana,"Human Movement Characterization in Indoor Environment using GNU Radio Based Radar", Retrieved at: http://repository.tudelft.nl/islandora/object/uuid:414e1868-dd00-4113-9989-4c213f1f7094?collection=education, Nov. 30, 2009, 100 pages.
He,"A Continuous, Wearable, and Wireless Heart Monitor Using Head Ballistocardiogram (BCG) and Head Electrocardiogram (ECG) with a Nanowatt ECG Heartbeat Detection Circuit", In Proceedings: Thesis, Department of Electrical Engineering and Computer Science, Massachusetts Institute of Technology Available at: <http://dspace.mit.edu/handle/1721.1/79221>, Feb. 2013, 137 pages.
Holleis,"Evaluating Capacitive Touch Input on Clothes", Proceedings of the 10th International Conference on Human Computer Interaction, Jan. 1, 2008, 10 pages.
Nakajima,"Development of Real-Time Image Sequence Analysis for Evaluating Posture Change and Respiratory Rate of a Subject in Bed", In Proceedings: Physiological Measurement, vol. 22, No. 3 Retrieved From: <http://iopscience.iop.org/0967-3334/22/3/401/pdf/0967-3334_22_3_401.pdf> Feb. 27, 2015, Aug. 2001, 8 pages.
Patel,"Applications of Electrically Conductive Yarns in Technical Textiles", International Conference on Power System Technology (POWECON), Oct. 30, 2012, 6 pages.
Poh,"A Medical Mirror for Non-contact Health Monitoring", In Proceedings: ACM SIGGRAPH Emerging Technologies Available at: <http://affect.media.mit.edu/pdfs/11.Poh-etal-SIGGRAPH.pdf>, 2011, 1 page.
Poh,"Non-contact, Automated Cardiac Pulse Measurements Using Video Imaging and Blind Source Separation.", In Proceedings: Optics Express, vol. 18, No. 10 Available at: <http://www.opticsinfobase.org/view_article.cfm?gotourl=http%3A%2F%2Fwww%2Eopticsinfobase%2Eorg%2FDirectPDFAccess%2F77B04D55%2DBC95%2D6937%2D5BAC49A426378C02%5F199381%2Foe%2D18%2D10%2D10762%2Ep, May 7, 2010, 13 pages.
Pu,"Gesture Recognition Using Wireless Signals", Oct. 2014, pp. 15-18.
Pu,"Whole-Home Gesture Recognition Using Wireless Signals", MobiCom '13 Proceedings of the 19th annual international conference on Mobile computing & networking, Aug. 27, 2013, 12 pages.
Wang,"Exploiting Spatial Redundancy of Image Sensor for Motion Robust rPPG", In Proceedings: IEEE Transactions on Biomedical Engineering, vol. 62, Issue 2, Jan. 19, 2015, 11 pages.
Wang,"Micro-Doppler Signatures for Intelligent Human Gait Recognition Using a UWB Impulse Radar", 2011 IEEE International Symposium on Antennas and Propagation (APSURSI), Jul. 3, 2011, pp. 2103-2106.
Wijesiriwardana,"Capacitive Fibre-Meshed Transducer for Touch & Proximity Sensing Applications", IEEE Sensors Journal, IEEE Service Center, Oct. 1, 2005, 5 pages.
Zhadobov,"Millimeter-wave Interactions with the Human Body: State of Knowledge and Recent Advances", International Journal of Microwave and Wireless Technologies, Mar. 1, 2011, 11 pages.
Zhang,"Study of the Structural Design and Capacitance Characteristics of Fabric Sensor", Advanced Materials Research (vols. 194-196), Feb. 21, 2011, 8 pages.
"Corrected Notice of Allowance", U.S. Appl. No. 14/504,061, dated Dec. 27, 2016, 2 pages.
"Corrected Notice of Allowance", U.S. Appl. No. 14/582,896, dated Dec. 19, 2016, 2 pages.
"International Search Report and Written Opinion", Application No. PCT/US2016/024289, dated Aug. 25, 2016, 17 pages.
Cheng,"Smart Textiles: From Niche to Mainstream", IEEE Pervasive Computing, Jul. 2013, pp. 81-84.
Farrngdon,"Wearable Sensor Badge & Sensor Jacket for Context Awareness", Third International Symposium on Wearable Computers, Oct. 1999, 7 pages.

(56) References Cited

OTHER PUBLICATIONS

Schneegass,"Towards a Garment OS: Supporting Application Development for Smart Garments", Wearable Computers, ACM, Sep. 2014, 6 pages.
"Combined Search and Examination Report", GB Application No. 1620892.8, dated Apr. 6, 2017, 5 pages.
"Corrected Notice of Allowance", U.S. Appl. No. 14/930,220, dated Mar. 20, 2017, 2 pages.
"Corrected Notice of Allowance", U.S. Appl. No. 14/930,220, dated May 11, 2017, 2 pages.
"Final Office Action", U.S. Appl. No. 14/518,863, dated May 5, 2017, 18 pages.
"First Action Interview Office Action", U.S. Appl. No. 14/959,901, dated Apr. 14, 2017, 3 pages.
"International Preliminary Report on Patentability", Application No. PCT/US2015/050903, dated Apr. 13, 2017, 12 pages.
"International Search Report and Written Opinion", Application No. PCT/US2016/060399, dated Jan. 30, 2017, 11 pages.
"Non-Final Office Action", U.S. Appl. No. 14/504,038, dated Mar. 22, 2017, 33 pages.
"Non-Final Office Action", U.S. Appl. No. 15/398,147, dated Mar. 9, 2017, 10 pages.
"Non-Final Office Action", U.S. Appl. No. 15/403,066, dated May 4, 2017, 31 pages.
"Notice of Allowance", U.S. Appl. No. 14/494,863, dated May 30, 2017, 7 pages.
"Pre-Interview Communication", U.S. Appl. No. 15/343,067, dated Apr. 19, 2017, 3 pages.
"Textile Wire Brochure", Retrieved at: http://www.textile-wire.ch/en/home.html, Aug. 7, 2004, 17 pages.
Stoppa,"Wearable Electronics and Smart Textiles: A Critical Review", In Proceedings of Sensors, vol. 14, Issue 7, Jul. 7, 2014, pp. 11957-11992.
"Final Office Action", U.S. Appl. No. 15/286,512, dated Dec. 26, 2018, 15 pages.
"International Preliminary Report on Patentability", PCT Application No. PCT/US2017/032733, dated Nov. 29, 2018, 7 pages.
"Non-Final Office Action", U.S. Appl. No. 14/959,901, dated Oct. 11, 2018, 22 pages.
"Non-Final Office Action", U.S. Appl. No. 15/287,308, dated Oct. 15, 2018, 18 pages.
"Non-Final Office Action", U.S. Appl. No. 15/286,152, dated Oct. 19, 2018, 27 pages.
"Non-Final Office Action", U.S. Appl. No. 15/286,837, dated Oct. 26, 2018, 10 pages.
"Non-Final Office Action", U.S. Appl. No. 15/286,537, dated Nov. 19, 2018, 18 pages.
"Non-Final Office Action", U.S. Appl. No. 15/287,155, dated Dec. 10, 2018, 12 pages.
"Notice of Allowance", U.S. Appl. No. 15/595,649, dated Jan. 3, 2019, 5 pages.
"Notice of Allowance", U.S. Appl. No. 15/142,689, dated Oct. 30, 2018, 9 pages.
"Notice of Allowance", U.S. Appl. No. 15/287,200, dated Nov. 6, 2018, 19 pages.
"Preliminary Report on Patentability", PCT Application No. PCT/US2016/062082, dated Nov. 15, 2018, 8 pages.
"Restriction Requirement", U.S. Appl. No. 15/462,957, dated Jan. 4, 2019, 6 pages.
"Written Opinion", PCT Application No. PCT/US2017/051663, dated Oct. 12, 2018, 8 pages.
Gürbüz, et al., "Detection and Identification of Human Targets in Radar Data", Proc. SPIE 6567, Signal Processing, Sensor Fusion, and Target Recognition XVI, 656701, May 7, 2007, 12 pages.
"Combined Search and Examination Report", GB Application No. 1620891.0, dated May 31, 2017, 9 pages.
"Final Office Action", U.S. Appl. No. 15/398,147, dated Jun. 30, 2017, 11 pages.
"Final Office Action", U.S. Appl. No. 14/874,955, dated Jun. 30, 2017, 9 pages.

"Final Office Action", U.S. Appl. No. 14/959,799, dated Jul. 19, 2017, 12 pages.
"Final Office Action", U.S. Appl. No. 14/504,121, dated Aug. 8, 2017, 16 pages.
"International Search Report and Written Opinion", Application No. PCT/US2016/063874, dated May 11, 2017, 19 pages.
"Non-Final Office Action", U.S. Appl. No. 14/862,409, dated Jun. 22, 2017, 15 pages.
"Non-Final Office Action", U.S. Appl. No. 14/959,730, dated Jun. 23, 2017, 14 pages.
"Notice of Allowance", U.S. Appl. No. 14/513,875, dated Jun. 28, 2017, 7 pages.
"Notice of Allowance", U.S. Appl. No. 15/343,067, dated Jul. 27, 2017, 9 pages.
"Notice of Allowance", U.S. Appl. No. 14/504,038, dated Aug. 7, 2017, 17 pages.
"Final Office Action", U.S. Appl. No. 14/959,799, dated Jan. 4, 2018, 17 pages.
"Final Office Action", U.S. Appl. No. 14/959,730, dated Nov. 22, 2017, 16 pages.
"International Search Report and Written Opinion", PCT/US2017/047691, dated Nov. 16, 2017, 13.
"International Search Report and Written Opinion", PCT Application No. PCT/US2017/051663, dated Nov. 29, 2017, 16 pages.
"Non-Final Office Action", U.S. Appl. No. 14/504,121, dated Jan. 2, 2018, 19 pages.
"Non-Final Office Action", U.S. Appl. No. 14/959,901, dated Jan. 8, 2018, 21 pages.
"Non-Final Office Action", U.S. Appl. No. 14/504,139, dated Oct. 18, 2017, 12 pages.
"Non-Final Office Action", U.S. Appl. No. 15/595,649, dated Oct. 31, 2017, 16 pages.
"Non-Final Office Action", U.S. Appl. No. 14/862,409, dated Dec. 14, 2017, 17 pages.
"Notice of Allowance", U.S. Appl. No. 15/403,066, dated Jan. 8, 2018, 18 pages.
"Notice of Allowance", U.S. Appl. No. 14/874,955, dated Oct. 20, 2017, 7 pages.
"Notice of Allowance", U.S. Appl. No. 15/398,147, dated Nov. 15, 2017, 8 pages.
"Notice of Publication", U.S. Appl. No. 15/703,511, dated Jan. 4, 2018, 1 page.
"Restriction Requirement", U.S. Appl. No. 15/362,359, dated Jan. 8, 2018, 5 pages.
Bondade, et al., "A linear-assisted DC-DC hybrid power converter for envelope tracking RF power amplifiers", 2014 IEEE Energy Conversion Congress and Exposition (ECCE), IEEE, Sep. 14, 2014, pp. 5769-5773, XP032680873, DOI: 10.1109/ECCE.2014.6954193, Sep. 14, 2014, 5 pages.
Fan, et al., "Wireless Hand Gesture Recognition Based on Continuous-Wave Doppler Radar Sensors", IEEE Transactions on Microwave Theory and Techniques, Plenum, USA, vol. 64, No. 11, Nov. 1, 2016 (Nov. 1, 2016), pp. 4012-4012, XP011633246, ISSN: 0018-9480, DOI: 10.1109/TMTT.2016.2610427, Nov. 1, 2016, 9 pages.
Lien, et al., "Soli: Ubiquitous Gesture Sensing with Millimeter Wave Radar", ACM Transactions on Graphics (TOG), ACM, Us, vol. 35, No. 4, Jul. 11, 2016 (Jul. 11, 2016), pp. 1-19, XP058275791, ISSN: 0730-0301, DOI: 10.1145/2897824.2925953, Jul. 11, 2016, 19 pages.
Martinez-Garcia, et al., "Four-quadrant linear-assisted DC/DC voltage regulator", Analog Integrated Circuits and Signal Processing, Springer New York LLC, US, vol. 88, No. 1, Apr. 23, 2016 (Apr. 23, 2016), pp. 151-160, XP035898949, ISSN: 0925-1030, DOI: 10.1007/S10470-016-0747-8, Apr. 23, 2016, 10 pages.
Skolnik, "CW and Frequency-Modulated Radar", In: "Introduction to Radar Systems", Jan. 1, 1981 (Jan. 1, 1981), McGraw Hill, XP055047545, ISBN: 978-0-07-057909-5 pp. 68-100, p. 95-p. 97, Jan. 1, 1981, 18 pages.
Zheng, et al., "Doppler Bio-Signal Detection Based Time-Domain Hand Gesture Recognition", 2013 IEEE MTT-S International Microwave Workshop Series on RF and Wireless Technologies for Biomedical and Healthcare Applications (IMWS-BIO), IEEE, Dec. 9,

(56) References Cited

OTHER PUBLICATIONS 2013 (Dec. 9, 2013), p. 3, XP032574214, DOI: 10.1109/IMWS-BIO.2013.6756200, Dec. 9, 2013, 3 Pages.
"Corrected Notice of Allowance", U.S. Appl. No. 14/312,486, dated Jan. 23, 2017, 4 pages.
"Corrected Notice of Allowance", U.S. Appl. No. 14/582,896, dated Feb. 6, 2017, 2 pages.
"Corrected Notice of Allowance", U.S. Appl. No. 14/582,896, dated Feb. 23, 2017, 2 pages.
"International Preliminary Report on Patentability", Application No. PCT/US2015/043963, dated Feb. 16, 2017, 12 pages.
"International Preliminary Report on Patentability", Application No. PCT/US2015/030388, dated Dec. 15, 2016, 12 pages.
"International Preliminary Report on Patentability", Application No. PCT/US2015/043949, dated Feb. 16, 2017, 13 pages.
"International Preliminary Report on Patentability", Application No. PCT/US2015/044774, dated Mar. 2, 2017, 8 pages.
"International Search Report and Written Opinion", Application No. PCT/US2016/062082, dated Feb. 23, 2017, 12 pages.
"International Search Report and Written Opinion", Application No. PCT/US2016/055671, dated Dec. 1, 2016, 14 pages.
"Non-Final Office Action", U.S. Appl. No. 14/504,121, dated Jan. 9, 2017, 13 pages.
"Non-Final Office Action", U.S. Appl. No. 14/504,139, dated Jan. 27, 2017, 10 pages.
"Non-Final Office Action", U.S. Appl. No. 14/513,875, dated Feb. 21, 2017, 9 pages.
"Non-Final Office Action", U.S. Appl. No. 14/874,955, dated Feb. 27, 2017, 8 pages.
"Non-Final Office Action", U.S. Appl. No. 14/959,799, dated Jan. 27, 2017, 10 pages.
"Notice of Allowance", U.S. Appl. No. 14/930,220, dated Feb. 2, 2017, 8 pages.
"Pre-Interview Communication", U.S. Appl. No. 14/494,863, dated Jan. 27, 2017, 5 pages.
"Pre-Interview Communication", U.S. Appl. No. 14/959,730, dated Feb. 15, 2017, 3 pages.
"Pre-Interview Communication", U.S. Appl. No. 14/959,901, dated Feb. 10, 2017, 3 pages.
"Advisory Action", U.S. Appl. No. 14/504,139, dated Aug. 28, 2017, 3 pages.
"Final Office Action", U.S. Appl. No. 14/959,901, dated Aug. 25, 2017, 19 pages.
"Final Office Action", U.S. Appl. No. 15/403,066, dated Oct. 5, 2017, 31 pages.
"Non-Final Office Action", U.S. Appl. No. 15/093,533, dated Aug. 24, 2017, 18 pages.
"Non-Final Office Action", U.S. Appl. No. 15/142,619, dated Aug. 25, 2017, 16 pages.
"Non-Final Office Action", U.S. Appl. No. 14/959,799, dated Sep. 8, 2017, 16 pages.
"Non-Final Office Action", U.S. Appl. No. 15/398,147, dated Sep. 8, 2017, 7 pages.
"Non-Final Office Action", U.S. Appl. No. 14/518,863, dated Sep. 29, 2017, 20 pages.
"Non-Final Office Action", U.S. Appl. No. 15/142,689, dated Oct. 4, 2017, 18 pages.
"Pre-Interview Office Action", U.S. Appl. No. 14/862,409, dated Sep. 15, 2017, 16 pages.
"Written Opinion", PCT Application No. PCT/US2017/032733, dated Jul. 26, 2017, 5 pages.
"Final Office Action", U.S. Appl. No. 15/142,619, dated Feb. 8, 2018, 15 pages.
"Final Office Action", U.S. Appl. No. 15/093,533, dated Mar. 21, 2018, 19 pages.
"First Action Interview Office Action", U.S. Appl. No. 15/286,152, dated Mar. 1, 2018, 5 pages.
"Foreign Office Action", Chinese Application No. 201721290290.3, dated Mar. 9, 2018, 2 pages.
"Non-Final Office Action", U.S. Appl. No. 15/267,181, dated Feb. 8, 2018, 29 pages.
"Non-Final Office Action", U.S. Appl. No. 14/874,955, dated Feb. 8, 2018, 7 pages.
"Notice of Allowance", U.S. Appl. No. 14/959,730, dated Feb. 22, 2018, 8 pages.
"Pre-Interview Communication", U.S. Appl. No. 15/166,198, dated Mar. 8, 2018, 8 pages.
"Pre-Interview First Office Action", U.S. Appl. No. 15/286,152, dated Feb. 8, 2018, 4 pages.
"Corrected Notice of Allowance", U.S. Appl. No. 15/362,359, dated Sep. 17, 2018, 10 pages.
"Final Office Action", U.S. Appl. No. 14/504,121, dated Jul. 9, 2018, 23 pages.
"Final Office Action", U.S. Appl. No. 15/166,198, dated Sep. 27, 2018, 33 pages.
"Non-Final Office Action", U.S. Appl. No. 15/287,253, dated Sep. 7, 2018, 20 pages.
"Non-Final Office Action", U.S. Appl. No. 14/504,139, dated Oct. 5, 2018, 16 pages.
"Non-Final Office Action", U.S. Appl. No. 15/286,512, dated Jul. 19, 2018, 15 pages.
"Non-Final Office Action", U.S. Appl. No. 15/142,829, dated Aug. 16, 2018, 15 pages.
"Notice of Allowance", U.S. Appl. No. 15/362,359, dated Aug. 3, 2018, 8 pages.
"Notice of Allowance", U.S. Appl. No. 14/874,955, dated Oct. 4, 2018, 8 pages.
"Notice of Allowance", U.S. Appl. No. 15/142,619, dated Aug. 13, 2018, 9 pages.
"Notice of Allowance", U.S. Appl. No. 15/595,649, dated Sep. 14, 2018, 8 pages.
"Notice of Allowance", U.S. Appl. No. 15/586,174, dated Sep. 24, 2018, 5 pages.
"Pre-Interview Communication", U.S. Appl. No. 15/286,495, dated Sep. 10, 2018, 4 pages.
"Pre-Interview Communication", U.S. Appl. No. 15/287,359, dated Jul. 24, 2018, 2 pages.
"Restriction Requirement", U.S. Appl. No. 15/286,537, dated Aug. 27, 2018, 8 pages.
"Final Office Action", U.S. Appl. No. 15/287,155, dated Apr. 10, 2019, 11 pages.
"Final Office Action", U.S. Appl. No. 15/286,537, dated Apr. 19, 2019, 21 pages.
"Final Office Action", U.S. Appl. No. 14/959,901, dated May 30, 2019, 18 pages.
"First Action Interview Office Action", U.S. Appl. No. 15/917,238, dated Jun. 6, 2019, 6 pages.
"International Preliminary Report on Patentability", PCT Application No. PCT/US2017/051663, dated Jun. 20, 2019, 10 pages.
"Non-Final Office Action", U.S. Appl. No. 15/424,263, dated May 23, 2019, 12 pages.
"Non-Final Office Action", U.S. Appl. No. 15/462,957, dated May 24, 2019, 14 pages.
"Notice of Allowance", U.S. Appl. No. 15/703,511, dated Apr. 16, 2019, 5 pages.
"Pre-Interview Communication", U.S. Appl. No. 15/917,238, dated May 1, 2019, 6 pages.
"Final Office Action", U.S. Appl. No. 16/238,464, dated Jul. 25, 2019, 15 pages.
"Foreign Office Action", Chinese Application No. 201611191179.9, dated Aug. 28, 2019, 10 pages.
"Non-Final Office Action", U.S. Appl. No. 15/286,537, dated Sep. 3, 2019, 28 Pages.
"Notice of Allowance", U.S. Appl. No. 15/287,308, dated Jul. 17, 2019, 17 Pages.
"Notice of Allowance", U.S. Appl. No. 15/917,238, dated Aug. 21, 2019, 13 pages.
"Notice of Allowance", U.S. Appl. No. 16/389,402, dated Aug. 21, 2019, 7 Pages.
"Notice of Allowance", U.S. Appl. No. 15/287,253, dated Aug. 26, 2019, 13 Pages.

(56) References Cited

OTHER PUBLICATIONS

"Notice of Allowance", U.S. Appl. No. 15/287,155, dated Jul. 25, 2019, 7 pages.

* cited by examiner

CONNECTING AN ELECTRONIC COMPONENT TO AN INTERACTIVE TEXTILE

PRIORITY

This application claims priority to U.S. Provisional Patent Application Ser. No. 62/331,111 filed on May 3, 2016, the disclosure of which is incorporated by reference herein in its entirety.

BACKGROUND

An interactive textile includes conductive thread woven into the interactive textile to form a capacitive touch sensor that is configured to detect touch-input. The interactive textile can process the touch-input to generate touch data that is usable to initiate functionality at various remote devices that are wirelessly coupled to the interactive textile. For example, the interactive textile may aid users in controlling volume on a stereo, pausing a movie playing on a television, or selecting a webpage on a desk top computer. Due to the flexibility of textiles, the interactive textile may be easily integrated within flexible objects, such as clothing, handbags, fabric casings, hats, and so forth.

The interactive textile includes a grid or array of conductive thread woven into the interactive textile. Each conductive thread includes a conductive wire (e.g., a copper wire) that is twisted, braided, or wrapped with one or more flexible threads (e.g., polyester or cotton threads). It is difficult, however, for manufacturers to attach individual conductive threads to electronic components that may include electronics such as a processor, battery, wireless unit, sensors, and so forth.

SUMMARY

This document describes techniques and apparatuses for connecting an electronic component to an interactive textile. An interactive textile may include conductive thread woven into the interactive textile to form a capacitive touch sensor that is configured to detect touch-input. The conductive thread includes a conductive wire (e.g., a copper wire) that is twisted, braided, or wrapped with one or more flexible threads (e.g., polyester or cotton threads). To connect an electronic component to the conductive threads of the interactive textile, loose conductive threads of the interactive textile are collected and organized into a ribbon with a pitch that matches a corresponding pitch of connection points of the electronic component. Next, non-conductive material of the conductive threads of the ribbon are stripped to expose the conductive wires of the conductive threads. After stripping the non-conductive material from the conductive threads of the ribbon, the connection points of the electronic component are bonded to the conductive wires of the ribbon. The conductive threads proximate the ribbon are then sealed using a UV-curable or heat-curable epoxy, and the electronic component and the ribbon are encapsulated to the interactive textile with a water-resistant material, such as plastic or polymer.

This summary is provided to introduce simplified concepts concerning connecting an electronic component to an interactive textile, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of techniques and devices for connecting an electronic component to an interactive textile are described with reference to the following drawings. The same numbers are used throughout the drawings to reference like features and components.

DETAILED DESCRIPTION

Overview

Figure 1:
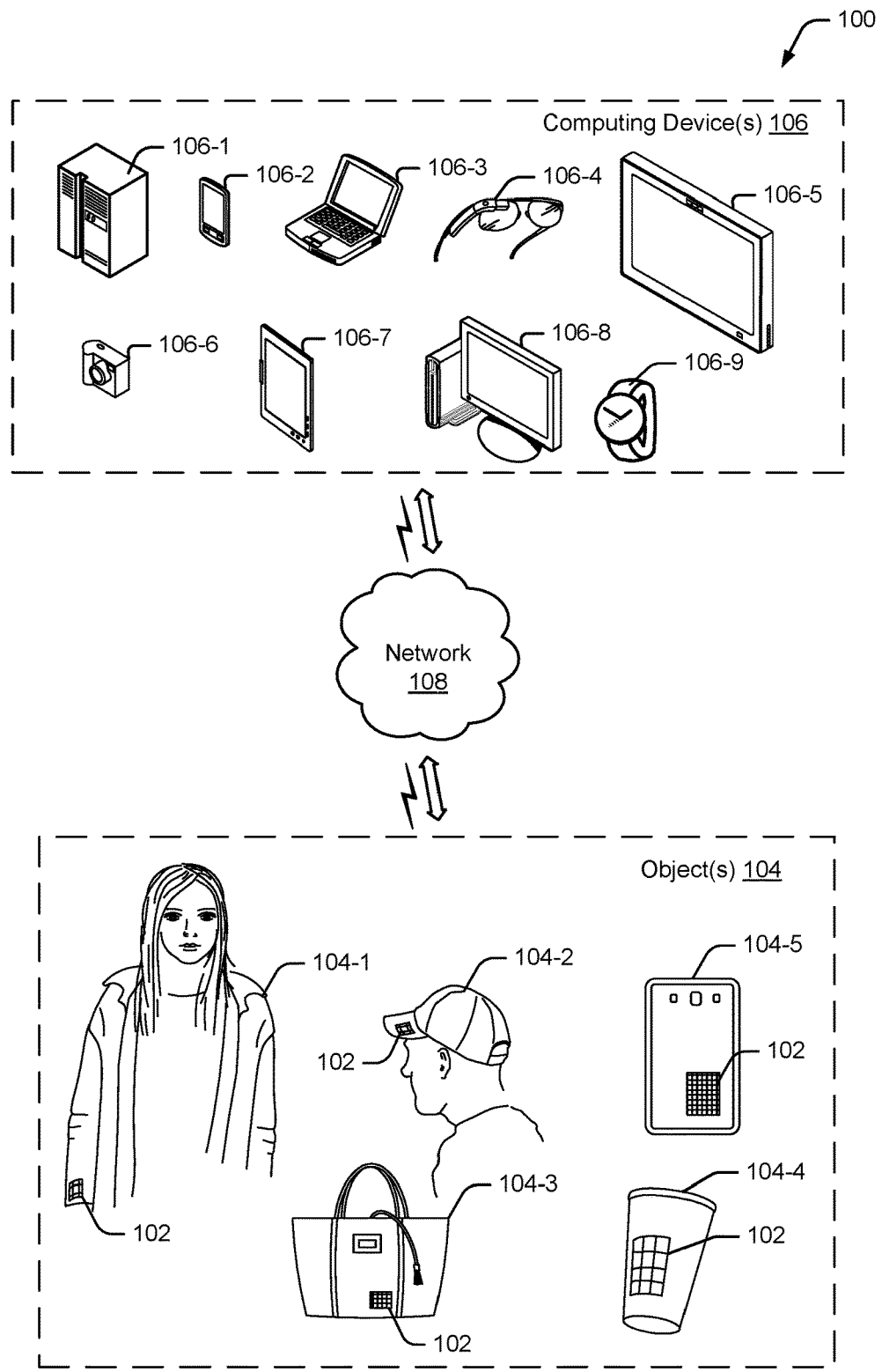
FIG. 1 is an illustration of an example environment in which an interactive textile may be embodied.

An interactive textile includes conductive thread woven into the interactive textile to form a capacitive touch sensor that is configured to detect touch-input. The interactive textile can process the touch-input to generate touch data that is usable to initiate functionality at various remote devices that are wirelessly coupled to the interactive textile. For example, the interactive textile may aid users in controlling volume on a stereo, pausing a movie playing on a television, or selecting a webpage on a desk top computer. Due to the flexibility of textiles, the interactive textile may be easily integrated within flexible objects, such as clothing, handbags, fabric casings, hats, and so forth.

In order to enable the interactive textile to sense multi-touch input, a connection process is applied to attach conductive threads, arranged in a grid or an array, to an electronic component, such as a flexible printed circuit board ("PCB"). The attachment process may include a ribbonization process in which a comb tool is utilized to collect and organize loose conductive threads that break out of the fabric surface of the interactive textile into a pitch that matches a corresponding pitch of connection points of the electronic component. The comb tool increases the speed and efficiency of the ribbonization process by being configured to properly space the conductive threads such that they correspond to the pitch of the connection points of the electronic component. In one or more implementations, the pitch of the comb tool may be mechanically-adjustable to enable the manufacturer to adjust the comb tool to the pitch of connection points of the particular electronic component. Then, a ribbon is generated by securing the organized conductive threads using a heat pressed film (e.g., tape, molded polymer silicone, or hot glue). Generating a ribbon, in which the conductive threads are arranged in a manner that corresponds to the pitch of the connection points of the electronic component enables easy alignment of the connection points of the electronic component with respective conductive threads of the ribbon.

Each conductive thread includes non-conductive material (e.g., silk, cotton, polyester or enamel) and a conductive wire (e.g., copper). The non-conductive material must be removed to enable the attachment of conductive threads to the connection points of the electronic component. Thus, after generating the ribbon, a stripping process is applied to remove the non-conductive material from the conductive threads of the ribbon so that the conductive wires are exposed. The stripping process may be performed in a variety of different ways, such as by heat stripping the conductive threads using a heating element (e.g., a heat pressed knife) that burns or melts the non-conductive material. In this case, a temperature of the heating element may be configured to melt or burn the non-conductive material of the conductive threads without melting or burning the conductive wire. When a heat pressed knife is used, the non-conductive material can be stripped from the conductive threads of the ribbon at a single time, making the process efficient. As another example, a laser beam can be utilized to abate the non-conductive material. In this case, an absorption of the laser is low to cause the laser beam to abate the non-conductive material without abating the conductive wire.

Next, a bonding process is applied to bond the exposed conductive wires of the ribbon to connection points of the electronic component. To do so, the conductive wires of the ribbon are aligned to the connection points of the electronic component with solder, and heat is applied to bond the connection points of the electronic component to the conductive threads of the ribbon. Since the conductive wires of the ribbon have the same pitch as the connection points of the electronic component, this process is similar to attaching standard cables.

In some embodiments, after bonding the electronic component to the stripped conductive threads of the ribbon, a sealing and encapsulation process may be applied to protect the conductive wires and the electronic component from water ingress and corrosion. In the sealing process, the conductive threads, adjacent to the ribbon are sealed with a UV-curable or heat-curable epoxy. Then, in the encapsulation process, the electronic component that is attached to the conductive threads is permanently mounted on the interactive textile by encapsulating the electronic component and the ribbon with a water-resistant material, such as plastic or polymer.

Example Environment

FIG. 1 is an illustration of an example environment 100 in which an interactive textile may be embodied. Environment 100 includes an interactive textile 102, which is shown as being integrated within various objects 104. Interactive textile 102 is a textile that is configured to sense multi-touch input. As described herein, a textile corresponds to any type of flexible woven material consisting of a network of natural or artificial fibers, often referred to as thread or yarn. Textiles may be formed by weaving, knitting, crocheting, knotting, or pressing threads together.

In environment 100, objects 104 include "flexible" objects, such as a shirt 104-1, a hat 104-2, and a handbag 104-3. It is to be noted, however, that interactive textile 102 may be integrated within any type of flexible object made from fabric or a similar flexible material, such as articles of clothing, blankets, shower curtains, towels, sheets, bed spreads, or fabric casings of furniture, to name just a few. Interactive textile 102 may be integrated within flexible objects 104 in a variety of different ways, including weaving, sewing, gluing, and so forth.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. Interactive textile 102 may be integrated within hard objects 104 using a variety of different manufacturing processes. In one or more implementations, injection molding is used to integrate interactive textiles 102 into hard objects 104.

Interactive textile 102 enables a user to control object 104 that the interactive textile 102 is integrated with, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desk top 106-8, and smart watch 106-9, though other devices may also be used, such as home automation and control systems, sound or entertainment systems, home appliances, security systems, net books, and e-readers. Note that computing device 106 can be wearable (e.g., computing spectacles and smart watches), non-wearable but mobile (e.g., laptop and tablets), or relatively immobile (e.g., desk tops and servers).

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Interactive textile 102 can interact with computing devices 106 by transmitting touch data through network 108.

Computing device 106 uses the touch data to control computing device 106 or applications at computing device 106. As an example, consider that interactive textile 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on interactive textile 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by interactive textile 102.

Figure 2:
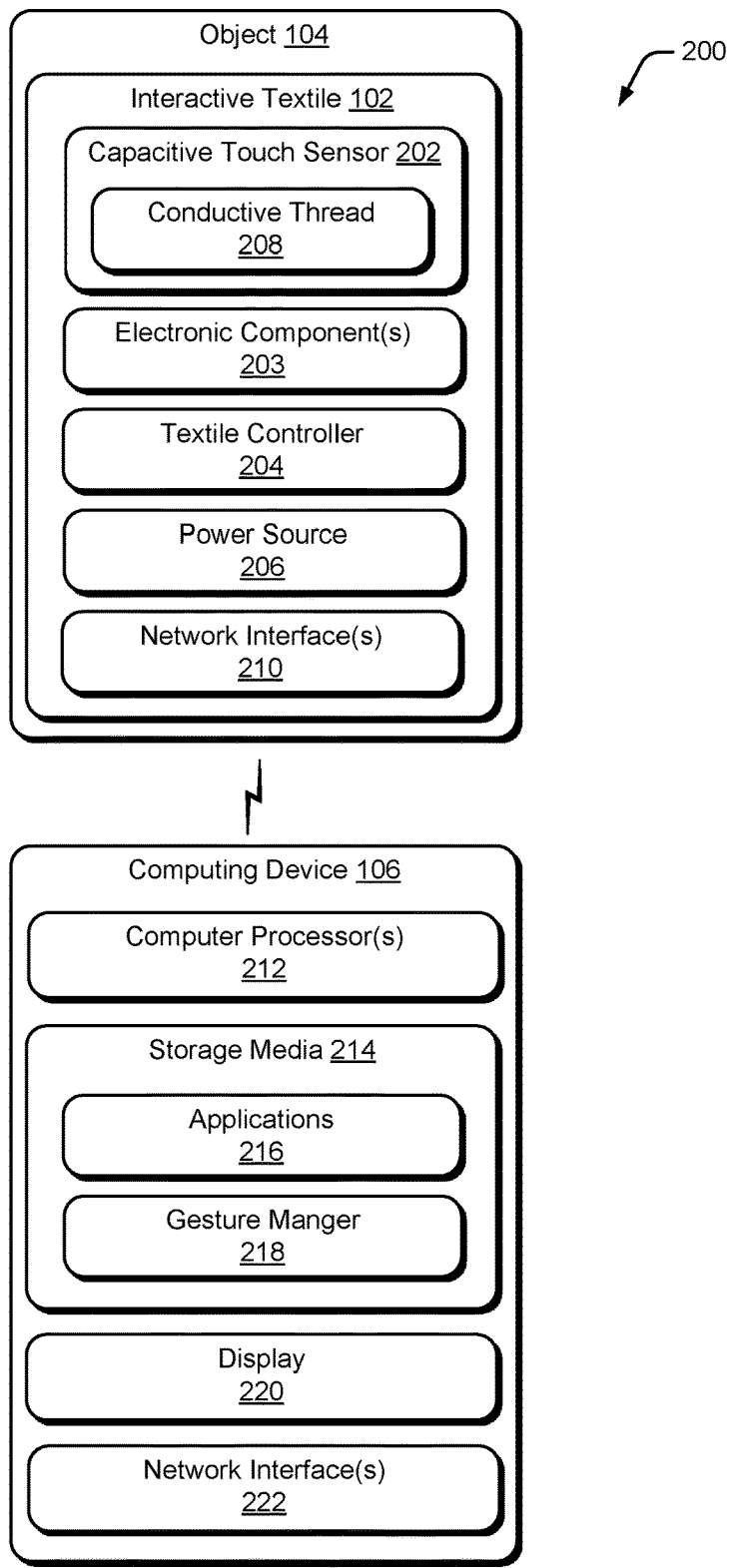
FIG. 2 illustrates an example system that includes an interactive textile and a gesture manager.

In more detail, consider FIG. 2 which illustrates an example system 200 that includes an interactive textile and a gesture manager. In system 200, interactive textile 102 is integrated in an object 104, which may be implemented as a flexible object (e.g., shirt 104-1, hat 104-2, or handbag 104-3) or a hard object (e.g., plastic cup 104-4 or smart phone casing 104-5).

Interactive textile 102 is configured to sense multi-touch-input from a user when one or more fingers of the user's hand touch interactive textile 102. Interactive textile 102 may also be configured to sense full-hand touch input from a user, such as when an entire hand of the user touches or swipes interactive textile 102. To enable this, interactive textile 102 includes a capacitive touch sensor 202 that is coupled to one or more electronic components 203, such as flexible circuit boards, sensors, heating elements, and so forth. In some cases, electronic component 203 may include a textile controller 204 and a power source 206.

Capacitive touch sensor 202 is configured to sense touch-input when an object, such as a user's finger, hand, or a conductive stylus, approaches or makes contact with capacitive touch sensor 202. Unlike conventional hard touch pads, capacitive touch sensor 202 uses a conductive thread 208 woven into interactive textile 102 to sense touch-input. Thus, capacitive touch sensor 202 does not alter the flexibility of interactive textile 102, which enables interactive textile 102 to be easily integrated within objects 104.

Power source 206 is coupled to textile controller 204 to provide power to textile controller 204, and may be implemented as a small battery. Textile controller 204 is coupled to capacitive touch sensor 202. For example, wires from the conductive threads 208 may be connected to textile controller 204 using flexible PCB, creping, gluing with conductive glue, soldering, and so forth.

In one or more implementations, electronic components 203 may also include one or more output devices, such as light sources (e.g., LED's), displays, or speakers. In this case, the output devices may also be connected to textile controller 204 to enable textile controller 204 to control their output.

Textile controller 204 is implemented with circuitry that is configured to detect the location of the touch-input on conductive thread 208, as well as motion of the touch-input. When an object, such as a user's finger, touches capacitive touch sensor 202, the position of the touch can be determined by controller 204 by detecting a change in capacitance on the grid of conductive thread 208. Textile controller 204 uses the touch-input to generate touch data usable to control computing device 102. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile). Capacitive touch sensor 202 may be implemented as a self-capacitance sensor, or a projective capacitance sensor, which is discussed in more detail below.

Object 104 may also include network interfaces 210 for communicating data, such as touch data, over wired, wireless, or optical networks to computing devices 106. By way of example and not limitation, network interfaces 210 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1).

In this example, computing device 106 includes one or more computer processors 212 and computer-readable storage media (storage media) 214. Storage media 214 includes applications 216 and/or an operating system (not shown) embodied as computer-readable instructions executable by computer processors 212 to provide, in some cases, functionalities described herein. Storage media 214 also includes a gesture manager 218 (described below).

Computing device 106 may also include a display 220 and network interfaces 222 for communicating data over wired, wireless, or optical networks. For example, network interfaces 222 can receive touch data sensed by interactive textile 102 from network interfaces 210 of object 104. By way of example and not limitation, network interface 222 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like.

Gesture manager 218 is capable of interacting with applications 216 and interactive textile 102 effective to activate various functionalities associated with computing device 106 and/or applications 216 through touch-input (e.g., gestures) received by interactive textile 102. Gesture manager 218 may be implemented at a computing device 106 that is local to object 104, or remote from object 104.

Having discussed a system in which interactive textile 102 can be implemented, now consider a more-detailed discussion of interactive textile 102.

Figure 3:
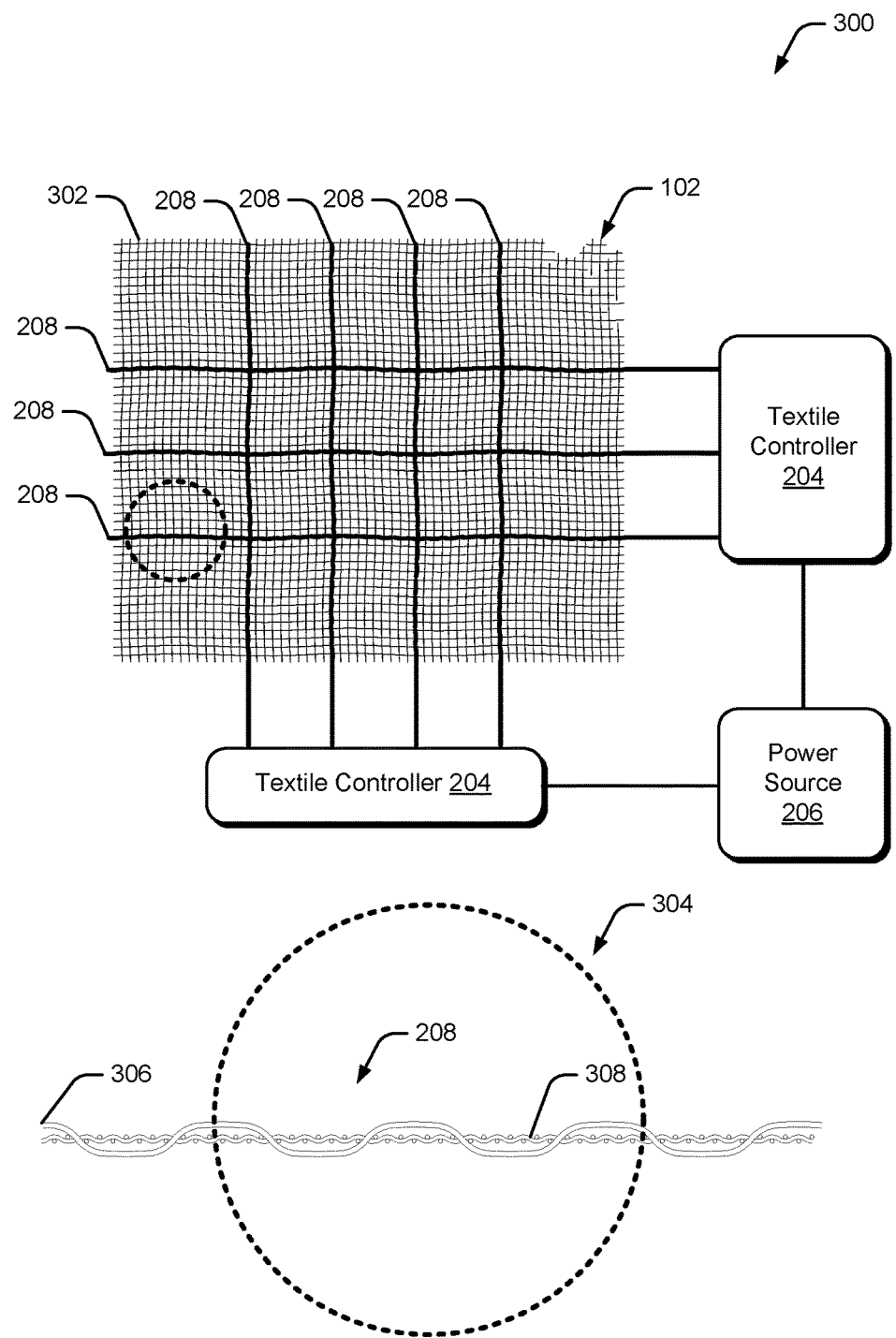
FIG. 3 illustrates an example of an interactive textile in accordance with one or more implementations.

FIG. 3 illustrates an example 300 of interactive textile 102 in accordance with one or more implementations. In this example, interactive textile 102 includes non-conductive threads 302 woven with conductive threads 208 to form interactive textile 102. Non-conductive threads 302 may correspond to any type of non-conductive thread, fiber, or fabric, such as cotton, wool, silk, nylon, polyester, and so forth.

At 304, a zoomed-in view of conductive thread 208 is illustrated. Conductive thread 208 includes a conductive wire 306 that is twisted, braided, or wrapped with a flexible thread 308. Twisting conductive wire 306 with flexible thread 308 causes conductive thread 208 to be flexible and stretchy, which enables conductive thread 208 to be easily woven with non-conductive threads 302 to form interactive textile 102.

In one or more implementations, conductive wire 306 is a thin copper wire. It is to be noted, however, that conductive wire 306 may also be implemented using other materials, such as silver, gold, or other materials coated with a conductive polymer. Flexible thread 308 may be implemented as any type of flexible thread or fiber, such as cotton, wool, silk, nylon, polyester, and so forth.

In one or more implementations, conductive thread 208 includes a conductive core that includes at least one conductive wire 306 (e.g., one or more copper wires) and a cover layer, configured to cover the conductive core, that is constructed from flexible threads 308. In some cases, conductive wire 306 of the conductive core is insulated. Alternately, conductive wire 306 of the conductive core is not insulated.

In one or more implementations, the conductive core may be implemented using a single, straight, conductive wire 306. Alternately, the conductive core may be implemented using a conductive wire 306 and one or more flexible threads 308. For example, the conductive core may be formed by twisting one or more flexible threads 308 (e.g., silk threads, polyester threads, or cotton threads) with conductive wire 306 (e.g., as shown at 304 of FIG. 3), or by wrapping flexible threads 308 around conductive wire 306.

In one or more implementations, the conductive core includes flexible threads 308 braided with conductive wire 306. A variety of different types of flexible threads 308 may be utilized to braid with conductive wire 306, such as polyester or cotton, in order to form the conductive core. In one or more implementations, however, silk threads are used for the braided construction of the conductive core. Silk threads are slightly twisted which enables the silk threads to "grip" or hold on to conductive wire 306. Thus, using silk threads may increase the speed at which the braided conductive core can be manufactured. In contrast, a flexible thread like polyester is slippery, and thus does not "grip" the conductive wire as well as silk. Thus, a slippery thread is more difficult to braid with the conductive wire, which may slow down the manufacturing process.

An additional benefit of using silk threads to create the braided conductive core is that silk is both thin and strong, which enables the manufacture of a thin conductive core that will not break during the interaction textile weaving process. A thin conductive core is beneficial because it enables the manufacturer to create whatever thickness they want for conductive thread 208 (e.g., thick or thin) when covering the conductive core with the second layer.

After forming the conductive core, a cover layer is constructed to cover the conductive core. In one or more implementations, the cover layer is constructed by wrapping flexible threads (e.g., polyester threads, cotton threads, wool threads, or silk threads) around the conductive core. For example, the cover layer may be formed by wrapping polyester threads around the conductive core at approximately 1900 turns per yard.

In one or more implementations, the cover layer includes flexible threads braided around the conductive core. The braided cover layer may be formed using the same type of braiding as described above. Any type of flexible thread 308 may be used for the braided cover layer. The thickness of the flexible thread and the number of flexible threads that are braided around the conductive core can be selected based on the desired thickness of conductive thread 208. For example, if conductive thread 208 is intended to be used for denim, a thicker flexible thread (e.g., cotton) and/or a greater number of flexible threads may be used to form the cover layer.

In one or more implementations, conductive thread 208 is constructed with a "double-braided" structure. In this case, the conductive core is formed by braiding flexible threads, such as silk, with a conductive wire (e.g., copper), as described above. Then, the cover layer is formed by braiding flexible threads (e.g., silk, cotton, or polyester) around the braided conductive core. The double-braided structure is strong, and thus is unlikely to break when being pulled during the weaving process. For example, when the double-braided conductive thread is pulled, the braided structure contracts and forces the braided core of copper to contract also with makes the whole structure stronger. Further, the double-braided structure is soft and looks like normal yarn, as opposed to a cable, which is important for aesthetics and feel.

Interactive textile 102 can be formed cheaply and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 302 with conductive threads 208 to create interactive textile 102.

In example 300, conductive thread 208 is woven into interactive textile 102 to form a grid that includes a set of substantially parallel conductive threads 208 and a second set of substantially parallel conductive threads 208 that crosses the first set of conductive threads to form the grid. In this example, the first set of conductive threads 208 are oriented horizontally and the second set of conductive threads 208 are oriented vertically, such that the first set of conductive threads 208 are positioned substantially orthogonal to the second set of conductive threads 208. It is to be appreciated, however, that conductive threads 208 may be oriented such that crossing conductive threads 208 are not orthogonal to each other. For example, in some cases crossing conductive threads 208 may form a diamond-shaped grid. While conductive threads 208 are illustrated as being spaced out from each other in FIG. 3, it is to be noted that conductive threads 208 may be weaved very closely together. For example, in some cases two or three conductive threads may be weaved closely together in each direction. Further, in some cases the conductive threads may be oriented as parallel sensing lines that do not cross or intersect with each other.

Conductive wire 306 may be insulated to prevent direct contact between crossing conductive threads 208. To do so, conductive wire 306 may be coated with a material such as enamel or nylon. Alternately, rather than insulating conductive wire 306, interactive textile may be generated with three separate textile layers to ensure that crossing conductive threads 208 do not make direct contact with each other. The three textile layers may be combined (e.g., by sewing or gluing the layers together) to form interactive textile 102. In this example, a first textile layer may include horizontal conductive threads 208 and a second textile layer may include vertical conductive threads 208. A third textile layer, that does not include any conductive threads, may be positioned between the first and second textile layers to prevent vertical conductive threads from making direct contact with horizontal conductive threads 208.

In one or more implementations, interactive textile 102 includes a top textile layer and a bottom textile layer. The top textile layer includes conductive threads 208 woven into the top textile layer, and the bottom textile layer also includes conductive threads woven into the bottom textile layer. When the top textile layer is combined with the bottom textile layer, the conductive threads from each layer form capacitive touch sensor 202. The top textile layer and the bottom textile layer may be combined in a variety of different ways, such as by weaving, sewing, or gluing the layers together to form interactive textile 102. In one or more implementations, the top and bottom textile layers are combined using a jacquard weaving process or any type of 3D-weaving process. When the top and bottom textile layers are combined, the conductive threads of the top layer couple to the conductive threads of the bottom layer to form capacitive touch sensor 202, as described above.

During operation, capacitive touch sensor 202 may be configured to determine positions of touch-input on the grid of conductive thread 208 using self-capacitance sensing or projective capacitive sensing.

When configured as a self-capacitance sensor, textile controller 204 charges crossing conductive threads 208 (e.g., horizontal and vertical conductive threads) by applying a control signal (e.g., a sine signal) to each conductive thread 208. When an object, such as the user's finger, touches the grid of conductive thread 208, the conductive threads 208 that are touched are grounded, which changes the capacitance (e.g., increases or decreases the capacitance) on the touched conductive threads 208.

Textile controller 204 uses the change in capacitance to identify the presence of the object. To do so, textile controller 204 detects a position of the touch-input by detecting which horizontal conductive thread 208 is touched, and which vertical conductive thread 208 is touched by detecting changes in capacitance of each respective conductive thread 208. Textile controller 204 uses the intersection of the crossing conductive threads 208 that are touched to determine the position of the touch-input on capacitive touch sensor 202. For example, textile controller 204 can determine touch data by determining the position of each touch as X, Y coordinates on the grid of conductive thread 208.

When implemented as a self-capacitance sensor, "ghosting" may occur when multi-touch input is received. Consider, for example, that a user touches the grid of conductive thread 208 with two fingers. When this occurs, textile controller 204 determines X and Y coordinates for each of the two touches. However, textile controller 204 may be unable to determine how to match each X coordinate to its corresponding Y coordinate. For example, if a first touch has the coordinates X1, Y1 and a second touch has the coordinates X4, Y4, textile controller 204 may also detect "ghost" coordinates X1, Y4 and X4, Y1.

In one or more implementations, textile controller 204 is configured to detect "areas" of touch-input corresponding to two or more touch-input points on the grid of conductive thread 208. Conductive threads 208 may be weaved closely together such that when an object touches the grid of conductive thread 208, the capacitance will be changed for multiple horizontal conductive threads 208 and/or multiple vertical conductive threads 208. For example, a single touch with a single finger may generate the coordinates X1, Y1 and X2, Y1. Thus, textile controller 204 may be configured to detect touch-input if the capacitance is changed for multiple horizontal conductive threads 208 and/or multiple vertical conductive threads 208. Note that this removes the effect of ghosting because textile controller 204 will not detect touch-input if two single-point touches are detected which are spaced apart.

Alternately, when implemented as a projective capacitance sensor, textile controller 204 charges a single set of conductive threads 208 (e.g., horizontal conductive threads 208) by applying a control signal (e.g., a sine signal) to the single set of conductive threads 208. Then, textile controller 204 senses changes in capacitance in the other set of conductive threads 208 (e.g., vertical conductive threads 208).

In this implementation, vertical conductive threads 208 are not charged and thus act as a virtual ground. However, when horizontal conductive threads 208 are charged, the horizontal conductive threads capacitively couple to vertical conductive threads 208. Thus, when an object, such as the user's finger, touches the grid of conductive thread 208, the capacitance changes on the vertical conductive threads (e.g., increases or decreases). Textile controller 204 uses the change in capacitance on vertical conductive threads 208 to identify the presence of the object. To do so, textile controller 204 detects a position of the touch-input by scanning vertical conductive threads 208 to detect changes in capacitance. Textile controller 204 determines the position of the touch-input as the intersection point between the vertical conductive thread 208 with the changed capacitance, and the horizontal conductive thread 208 on which the control signal was transmitted. For example, textile controller 204 can determine touch data by determining the position of each touch as X, Y coordinates on the grid of conductive thread 208.

Whether implemented as a self-capacitance sensor or a projective capacitance sensor, capacitive sensor 208 is configured to communicate the touch data to gesture manager 218 to enable gesture manager 218 to determine gestures based on the touch data, which can be used to control object 104, computing device 106, or applications 216 at computing device 106.

Gesture manager 218 can be implemented to recognize a variety of different types of gestures, such as touches, taps, swipes, holds, and covers made to interactive textile 102. To recognize the various different types of gestures, gesture manager 218 is configured to determine a duration of the touch, swipe, or hold (e.g., one second or two seconds), a number of the touches, swipes, or holds (e.g., a single tap, a double tap, or a triple tap), a number of fingers of the touch, swipe, or hold (e.g., a one finger-touch or swipe, a two-finger touch or swipe, or a three-finger touch or swipe), a frequency of the touch, and a dynamic direction of a touch or swipe (e.g., up, down, left, right). With regards to holds, gesture manager 218 can also determine an area of capacitive touch sensor 202 of interactive textile 102 that is being held (e.g., top, bottom, left, right, or top and bottom. Thus, gesture manager 218 can recognize a variety of different types of holds, such as a cover, a cover and hold, a five finger hold, a five finger cover and hold, a three finger pinch and hold, and so forth.

Connecting an Electronic Component to an Interactive Textile

In order to sense multi-touch input, conductive threads 208 are connected to electronic components 203, such as a flexible printed circuit board (PCB), during the manufacturing process. In various implementations, a connection process is utilized to connect an electronic component 203 to loose conductive threads 208 of an interactive textile 102. Consider, for example, FIG. 4 which illustrates an example connection system 400 which may be utilized to connect an electronic component to an interactive textile in accordance with one or more implementations.

Connection system 400 is configured to receive an interactive textile 102, which includes conductive threads 208 arranged in a grid or an array. As discussed above, each conductive thread 208 includes a conductive wire (e.g., a copper wire) that is twisted, braided, or wrapped with one or more flexible threads (e.g., polyester or cotton threads).

Interactive textile 102 is configured such that some of the conductive threads 208 are loose and break from the fabric of the interactive textile 102. Generally, connection system 400 can be implemented to connect electronic component 203 to the loose conductive threads 208 of interactive textile 102. Connection system 400 is illustrated as including a ribbonization component 402, a fabric stripping component 404, a bonding component 406, a sealing component 408, and an encapsulation component 410.

Ribbonization component 402 is representative of tools or functionality to arrange the loose conductive threads 208 of interactive textile 102 into a ribbon with a pitch that matches a pitch of connection points 412 (e.g., plates or pads) of electronic component 203. Stripping component receives the ribbon of conductive threads, and strips non-conductive material (e.g., silk or polyester) from the conductive threads 208 of the ribbon to expose the conductive wires. Next, bonding component 406 bonds connection points 412 of electronic component 203 to the conductive wires of the ribbon.

After connection points 412 of electronic component 203 are attached to the conductive threads 208 of interactive textile 102, the sealing component 408 seals the conductive threads 208 that are positioned adjacent to the ribbon to protect the conductive threads 208 against water ingress and corrosion. Then, the encapsulation component 410 applies a water-resistant material (e.g., a film, plastic, or polymer) to the electronic component 203 which permanently mounts the electronic component 203 to the interactive textile while also preventing water from being able to corrode the electronic component 203.

In one or more implementations, connection system 400 further includes a controller 414 which may be implemented in computer-executable instructions, and configured to control connection system 400 to attach electronic component 203 to interactive textile 102. For example, controller 414 is configured to control machinery of connection system 400 to automate at least a portion of the procedures performed by components 402 to 410.

Now, consider a more-detailed discussion of each of ribbonization component 402, stripping component 404, bonding component 406, sealing component 408, and encapsulation component 410.

Figure 4:
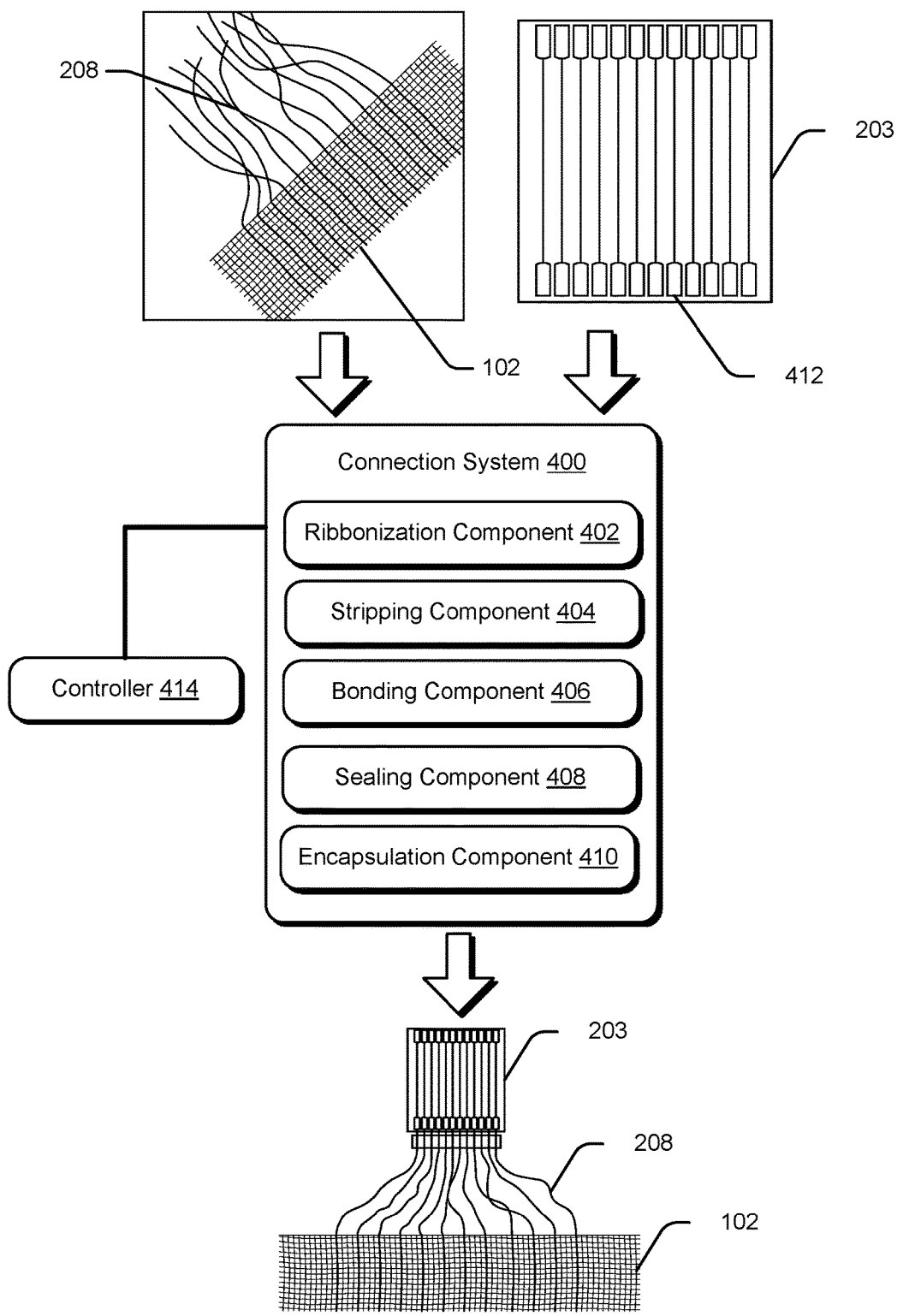
FIG. 4 illustrates an example connection system which may be utilized to connect an electronic component to an interactive textile in accordance with one or more implementations.
Figure 5:
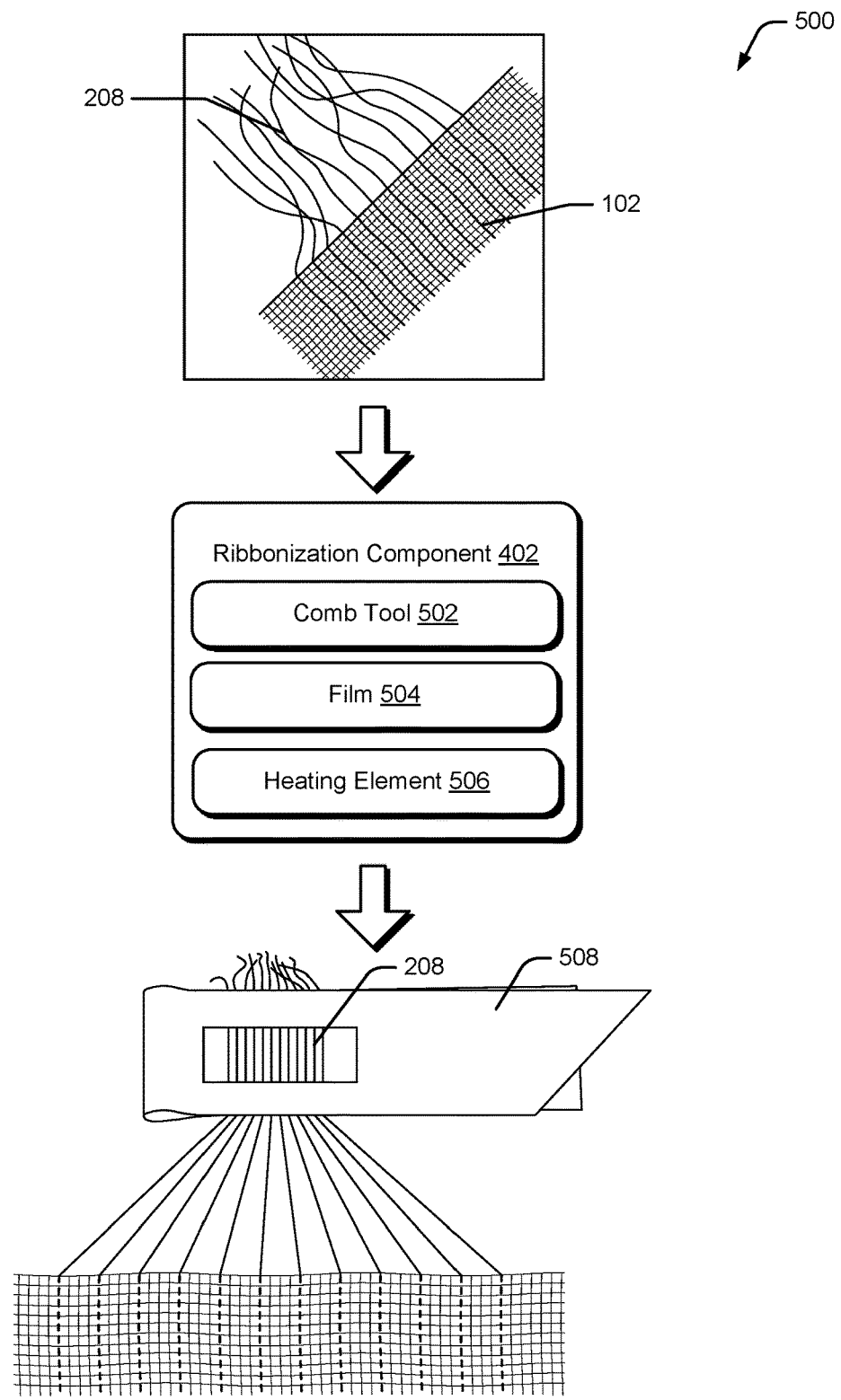
FIG. 5 illustrates a system in which the ribbonization component of FIG. 4 is implemented to arrange loose conductive threads of an interactive textile into a ribbon.

FIG. 5 illustrates a system 500 in which the ribbonization component of FIG. 4 is implemented to arrange loose conductive threads 208 of interactive textile 102 into a ribbon. In this example, ribbonization component 402 receives an interactive textile 102 with loose conductive threads 208, as described above. A comb tool 502, of ribbonization component, is utilized to collect the loose conductive threads 208 that break out of the fabric surface of the interactive textile 102, and organize the loose conductive threads into a pitch that matches the pitch of connection points 412 of electronic component 203. In one or more implementations, the pitch of the comb tool may be mechanically-adjustable (e.g., using a dial), to enable the manufacturer to adjust the pitch of comb tool 502 to correspond to the pitch of the particular electronic component 203.

For example, comb tool 502 includes multiple openings that are configured to receive the loose conductive threads 208 of interactive textile 102. The distance between each opening, or pitch, can be mechanically adjusted to conform the distance between openings of the comb tool 502 to the pitch of the connection points 412 of the electronic component 203. Thus, each of the loose conductive threads 208 may be collected and placed into one of the openings of the comb tool 502, thereby arranging the loose conductive threads 208 to conform to the pitch of the electronic component 203.

Next, a film 504 is placed over the organized conductive threads 208 within the comb tool 502. Film 504 may be implemented in a variety of different ways, such as scotch tape, molded polymer silicone, or hot glue, to name just a few. After film 504 is placed over the arranged conductive threads 208, a heating element 506 is applied to the film 504 to generate a hardened ribbon 508. Note that ribbon 508 secures the conductive threads 208, of interactive textile 102, such that the conductive threads 208 are permanently aligned with the of the connection points of electronic component 203.

Notably, ribbonization component 402, comb tool 502, and heating element 506 may be implemented in a variety of different ways. However, FIG. 6A-6C illustrate examples of a ribbonization component in accordance with one or more implementations.

Figure 6A:
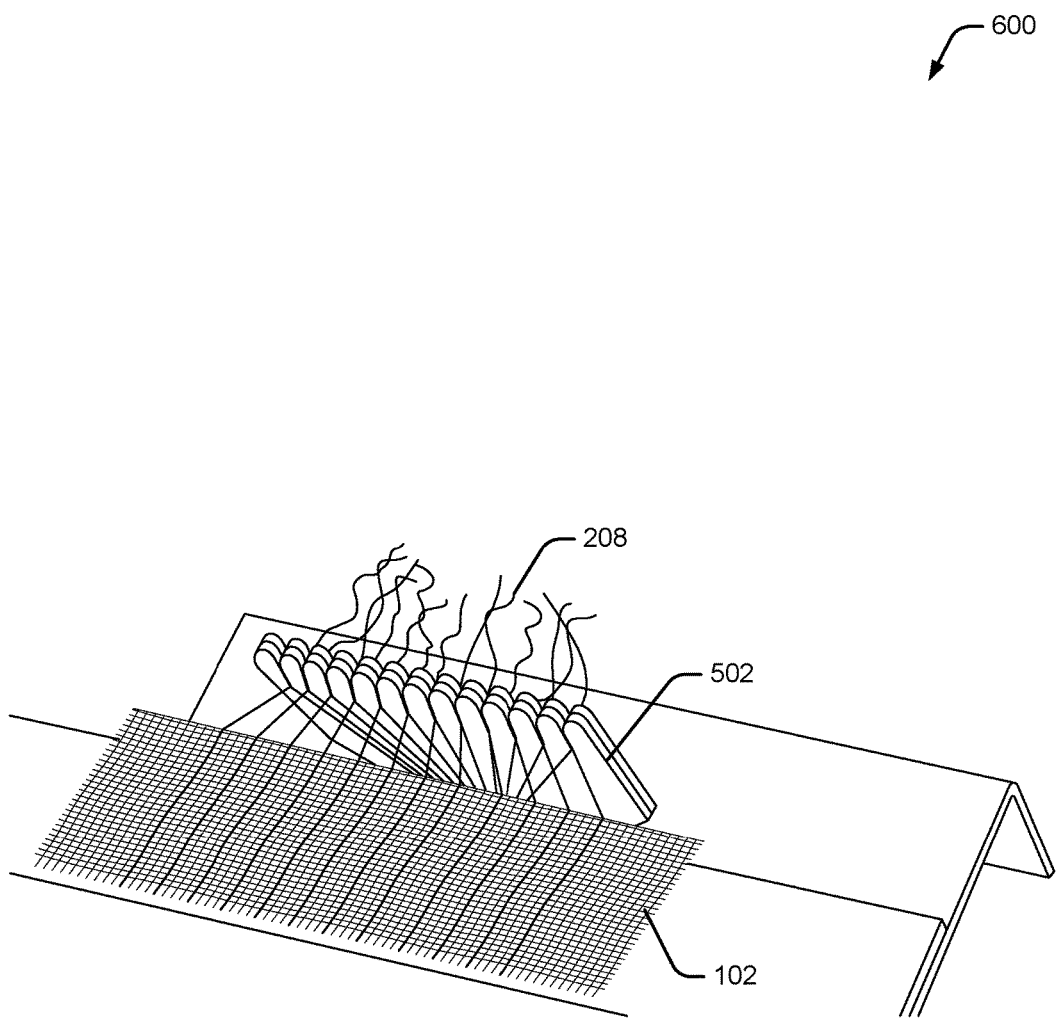
FIG. 6A illustrates an example of a comb tool of a ribbonization component in accordance with various implementations.

FIG. 6A illustrates an example 600 of a comb tool of a ribbonization component in accordance with various implementations. In this example, the loose conductive threads 208 of interactive textile 102 are collected and placed into each opening of the comb tool 502. In some cases, a user places the loose conductive threads 208 into each opening of comb tool 502. Alternately, this process may be at least partially automatic such that controller 414 controls machinery of connection system 400 to cause the loose conductive threads 208 to be placed into the openings of the comb tool 502.

Figure 6B:
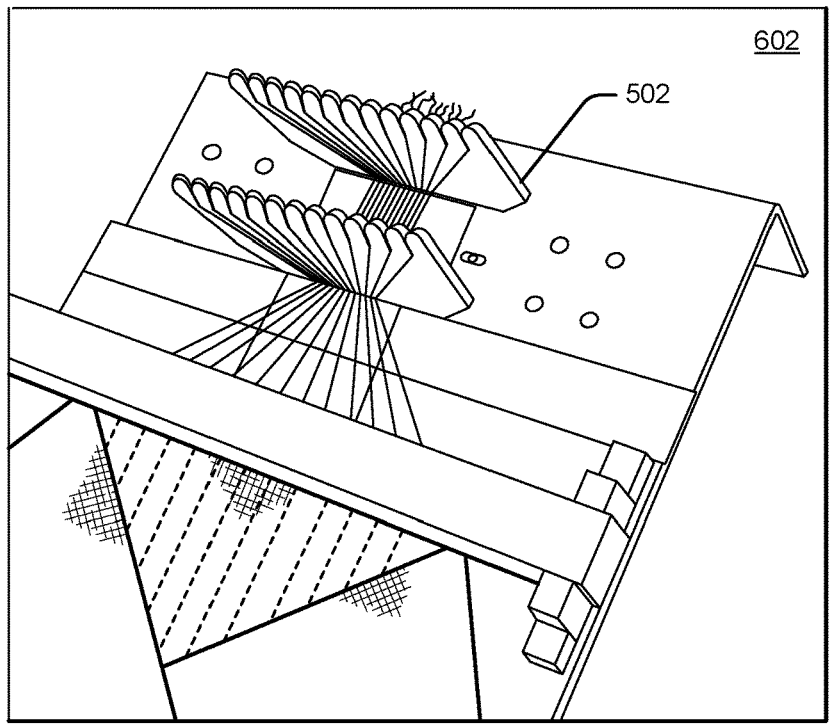
FIG. 6B illustrates an additional example of the comb tool of the ribbonization component in accordance with various implementations.
Figure 6B:
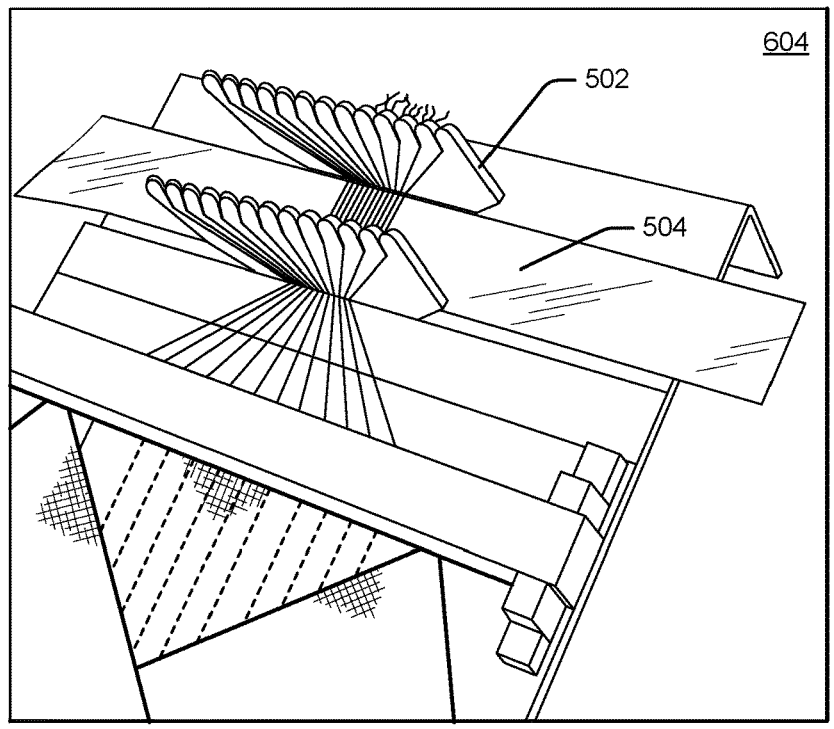

FIG. 6B illustrates an additional example of the comb tool of the ribbonization component in accordance with various implementations. At 602, the comb tool 502 is controlled to open to apply tension to the arranged conductive threads 208 within the comb tool 502. At 604, film 504 is applied to the arranged conductive threads 208 within the comb tool 502.

Figure 6C:
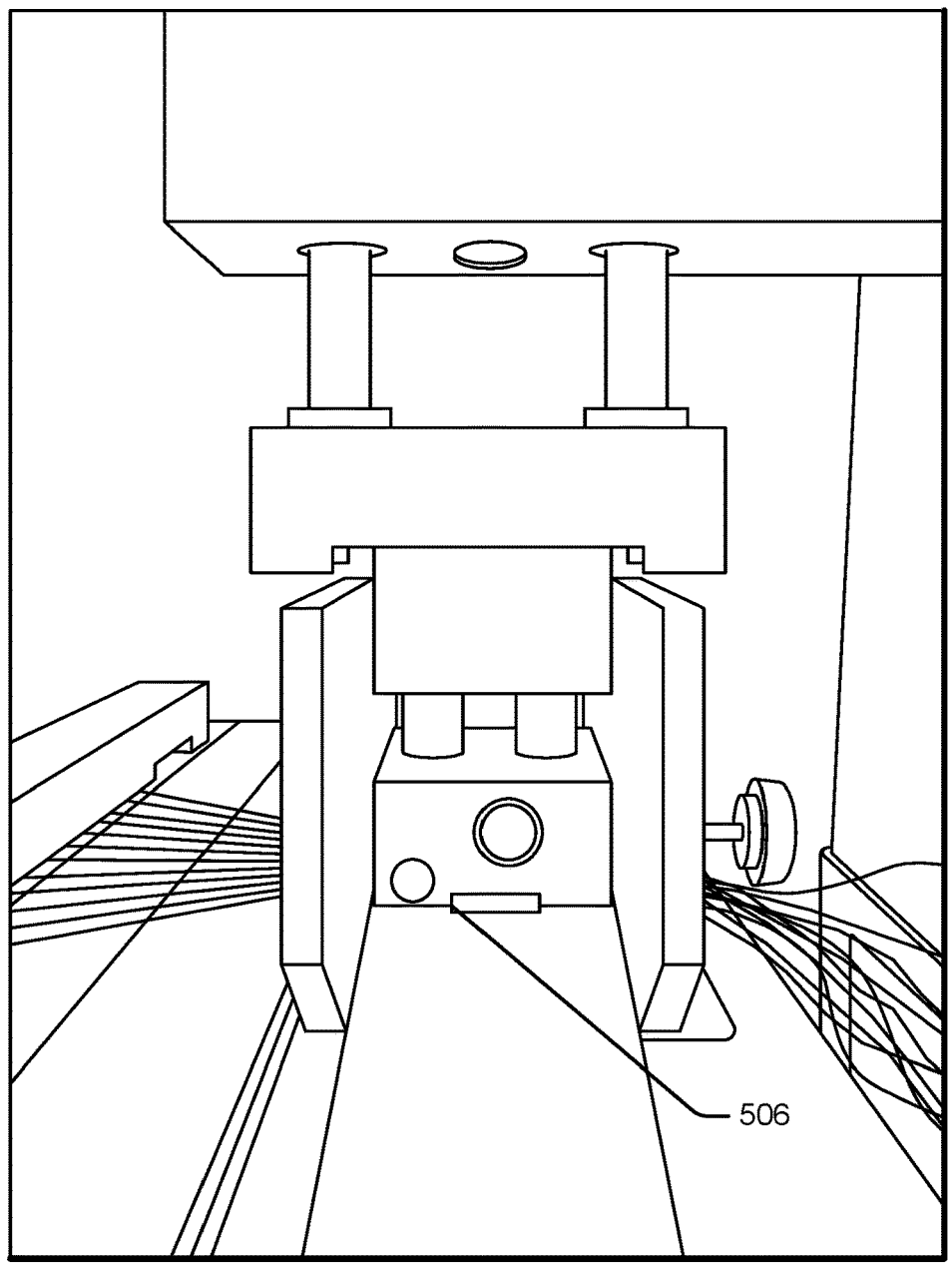
FIG. 6C illustrates an example of a heating element of the ribbonization component in accordance with various implementations.

FIG. 6C illustrates an example of a heating element of the ribbonization component in accordance with various implementations. In this example, heating element 506 is positioned over film 504, and pressed down to heat film 504, thereby generating the hardened ribbon 508 in which the organized conductive threads 208 are secured to match the pitch of connection points 412.

Figure 7:
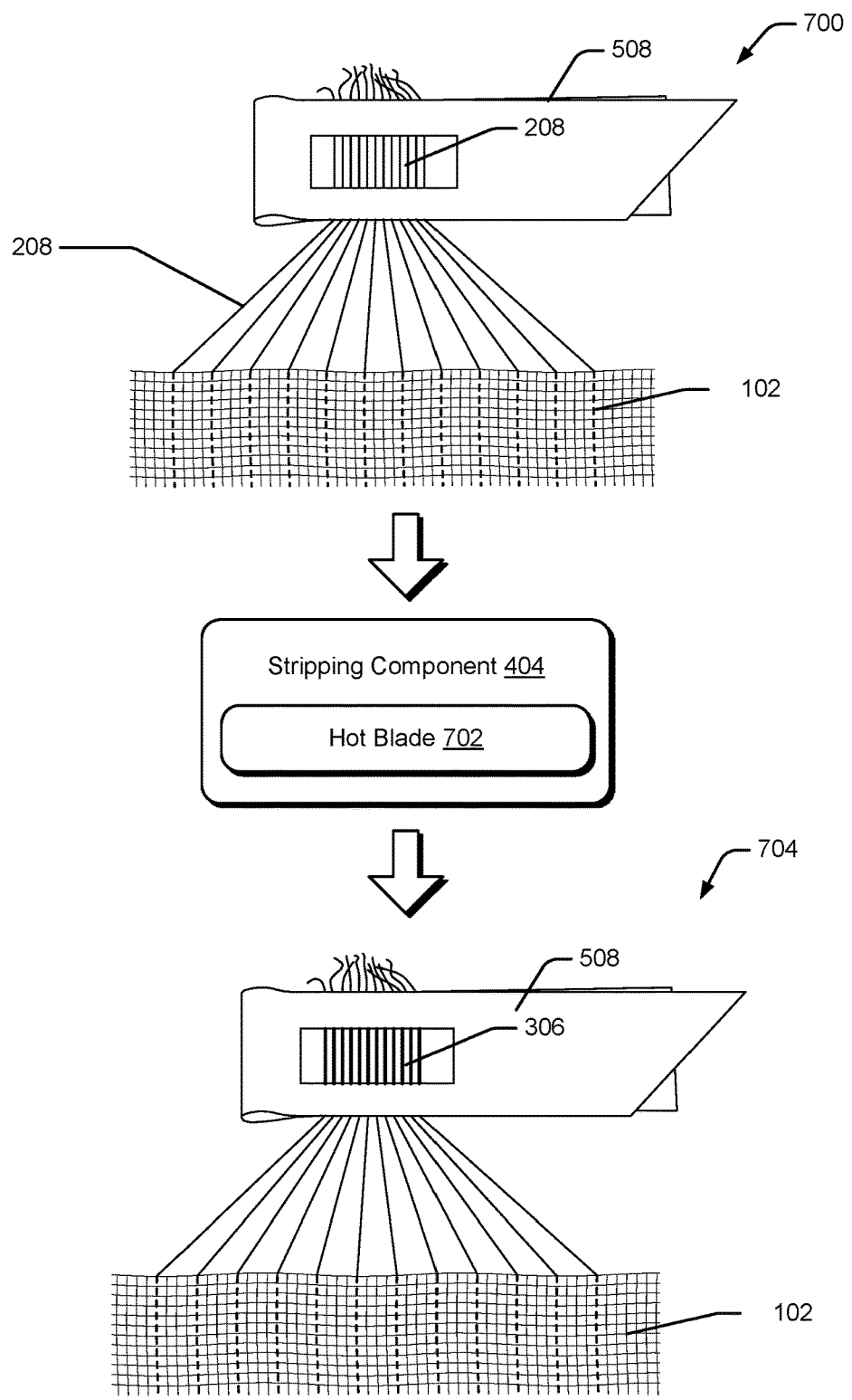
FIG. 7 illustrates a system in which the stripping component of FIG. 4 is implemented to remove non-conductive material from conductive threads of a ribbon in accordance with one or more implementations.

FIG. 7 illustrates a system 700 in which the stripping component 404 of FIG. 4 is implemented to remove non-conductive material from the conductive threads 208 of the ribbon 508 in accordance with one or more implementations. In this example, stripping component 404 receives the ribbon 508 generated by ribbonization component 402, as described above. As described throughout, each conductive thread of the ribbon 508 includes non-conductive material that needs to be removed to enable the attachment of the conductive threads of ribbon 508 to the connection points of the electronic component 203.

A hot blade 702 of stripping component 404 is utilized to strip or remove the non-conductive material (e.g., flexible threads 308, such as silk threads, polyester threads, or cotton threads) from the conductive threads 208 of ribbon 508. Doing so exposes the conductive wires 306 of conductive threads 208, which is illustrated at 704.

Hot blade 702 is configured to burn or melt the non-conductive material from conductive threads 208 without melting or burning the conductive wire 306 of conductive thread 208. To do so, a temperature of the hot blade 702 can be set such that the temperature is hot enough to burn or melt the non-conductive material without burning or melting the conductive wire 306.

Notably, using hot blade 702 increases the efficiency of the stripping process because the hot blade can strip the non-conductive material from the conductive threads 208 of the ribbon 508 at a single time, making the process efficient. Alternately, however, heating elements other than hot blade 702 may be used. For example, in one or more implementations, a laser beam can be utilized to abate the non-conductive material. In this case, an absorption of the laser is low to cause the laser beam to abate the non-conductive material without abating the conductive wire.

Figure 8A:
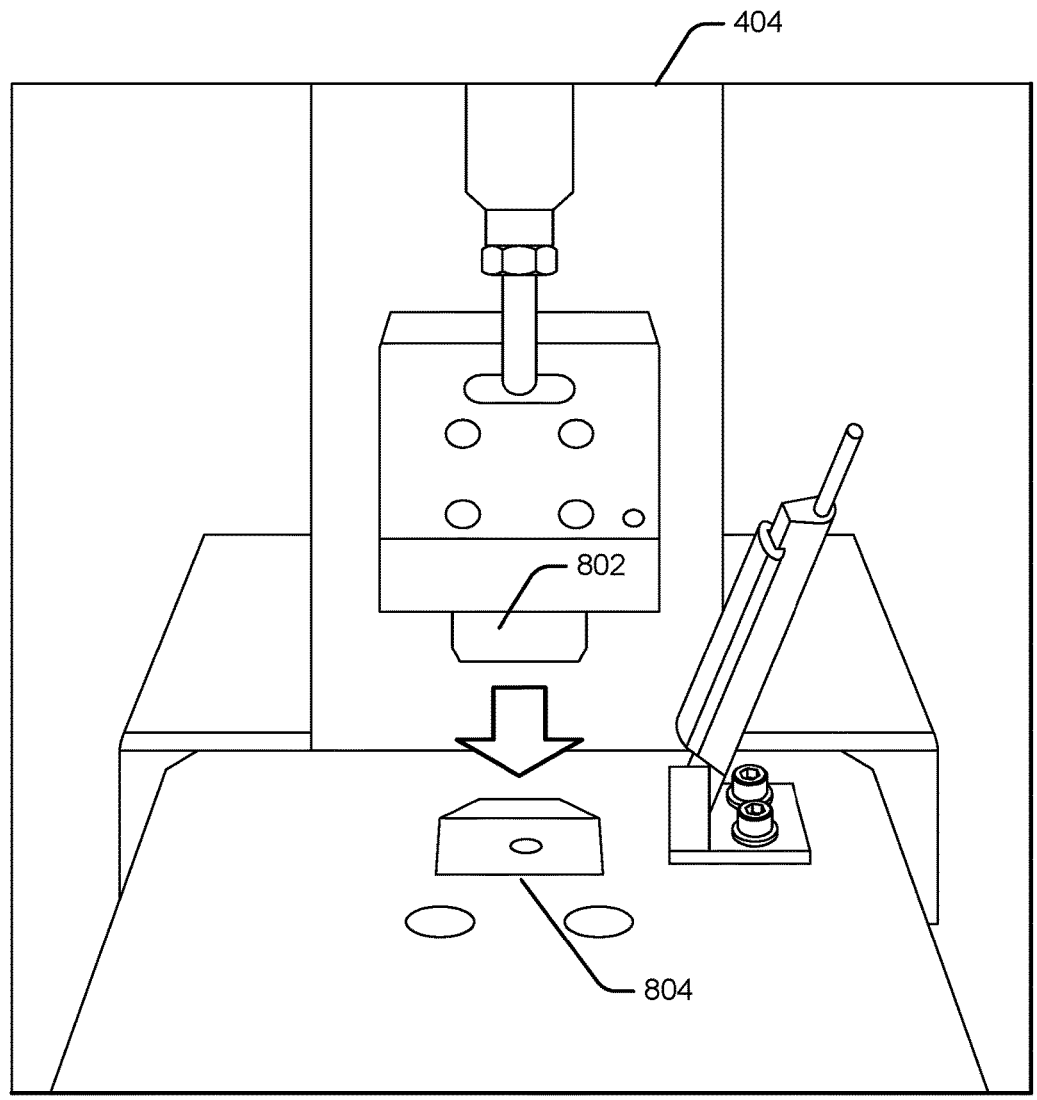
FIG. 8A illustrates an example of a stripping component in accordance with one or more implementations.

Notably, stripping component 404 may be implemented in a variety of different ways. However, FIG. 8A illustrates an example of a stripping component in accordance with one or more implementations. In this example, stripping component 404 is implemented as a "hand tool" which can be at least partially operated by a user. Stripping component 404 includes hot blade 702, which in this example includes an upper blade 802 and a lower blade 804.

Figure 8B:
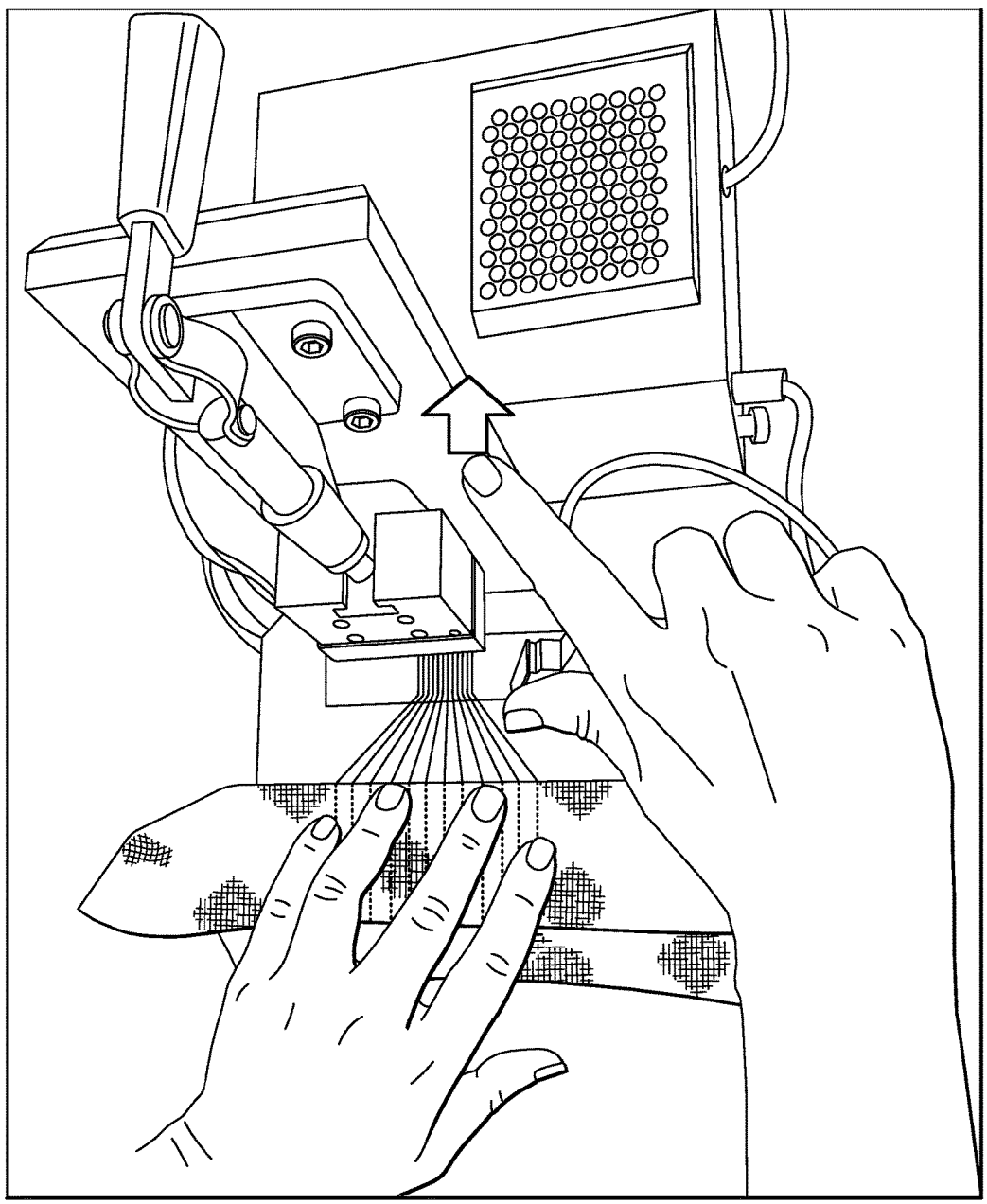
FIG. 8B illustrates an additional example of the stripping component in accordance with one or more implementations.

FIG. 8B illustrates an additional example of the stripping component in accordance with one or more implementations. In this example, ribbon 508 is placed on the stripping component 404 and aligned by placing the ribbon 508 over tension pins of the stripping component which line up with the outermost corners of the ribbon 508 and allow the ribbon to be properly centered. Tension can then be applied to the conductive thread of the ribbon by pushing the top blade back.

Figure 8C:
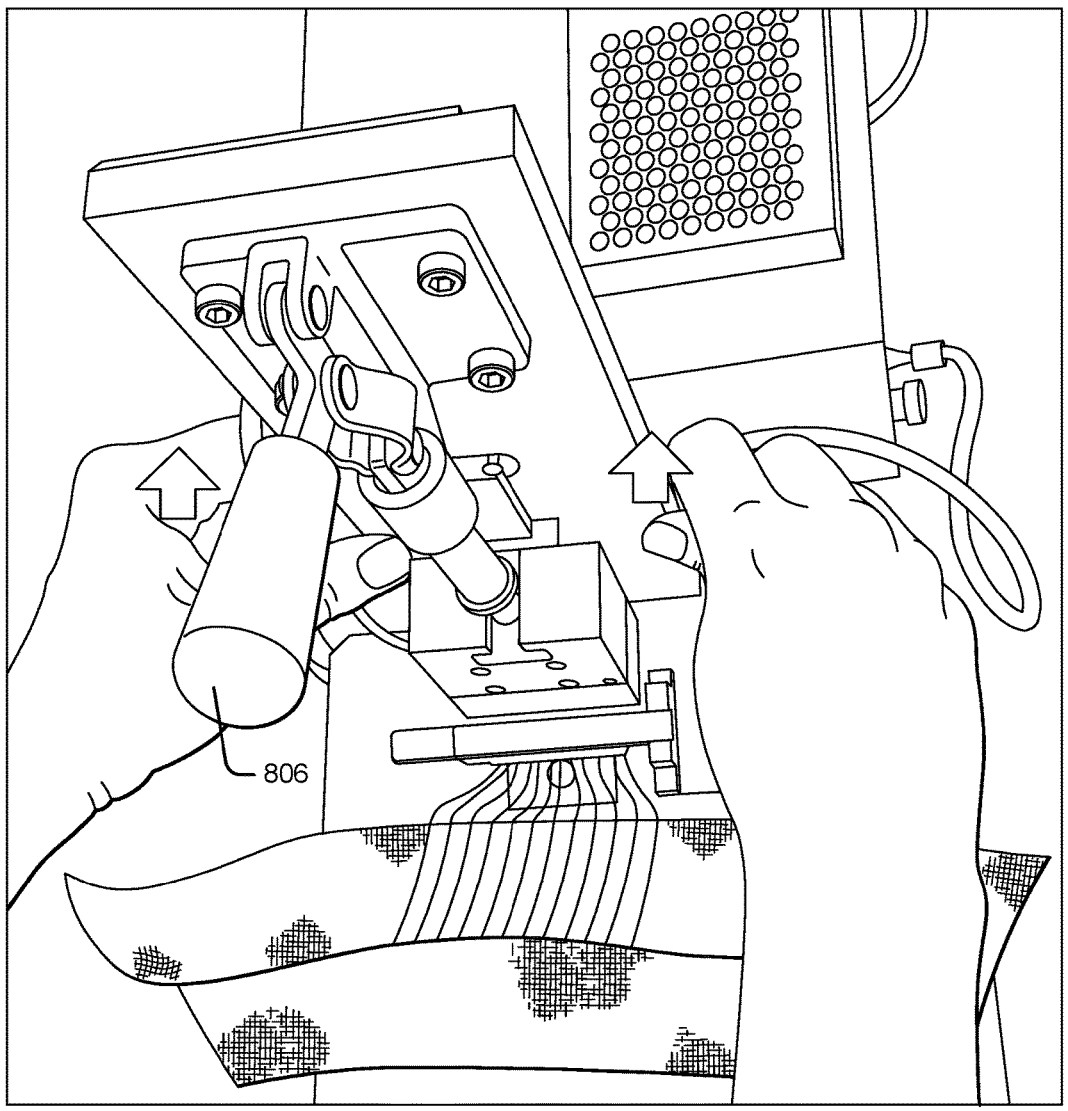
FIG. 8C illustrates an additional example of the stripping component in accordance with one or more implementations.

FIG. 8C illustrates an additional example of the stripping component in accordance with one or more implementations. In this example, a handle 806 is pulled towards the user to cause the upper blade 802 to rest on the lower blade 804. The blades are then heated to a temperature that is hot enough to burn or melt the non-conductive threads without burning or melting the conductive wire (e.g., a temperature of approximately 260 degrees Celsius). The upper blade 802 is allowed to rest on the lower blade 804 for a predefined period of time that causes the non-conductive threads to burn or melt (e.g., 12 seconds). Then, the blades are pushed away from the user to strip the non-conductive material from the conductive threads 208 of ribbon 508 to expose conductive wires 306.

Figure 9:
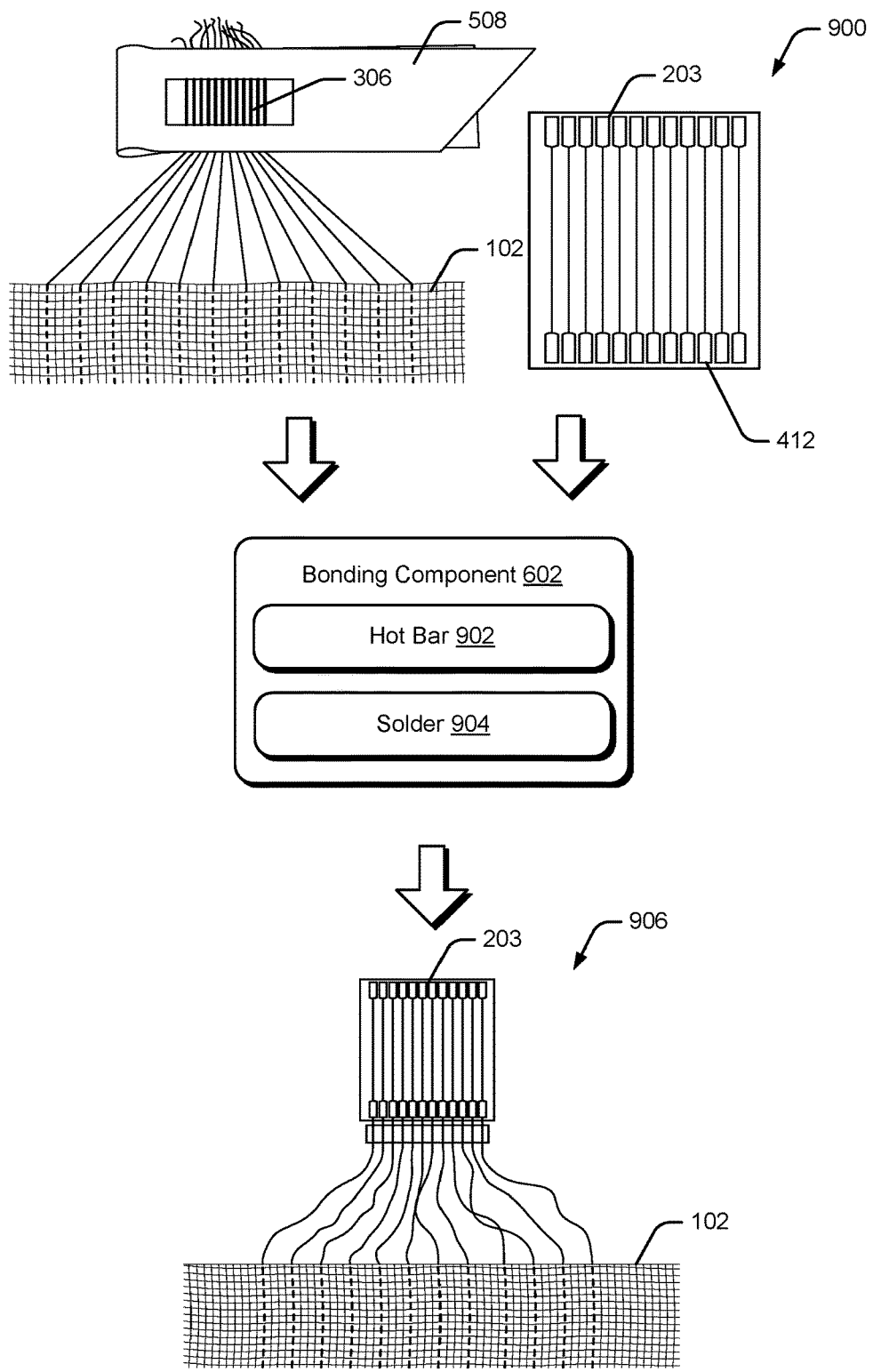
FIG. 9 illustrates a system in which the bonding component of FIG. 4 is implemented to bond an electronic component to conductive threads of a ribbon.

FIG. 9 illustrates a system 900 in which the bonding component of FIG. 4 is implemented to bond an electronic component to the conductive threads of the ribbon.

In this example, bonding component 406 receives the ribbon 508 with exposed conductive wires 306. The bonding component 406 aligns the connection points 412 of electronic component 203 with the stripped conductive wires 306 of ribbon 508. Next, bonding component 406 preps a hot bar 902 with solder 904, and applies heat by pressing the hot bar 902 with solder 904 against the exposed conductive wires 306 and the connection points 412 to cause each exposed conductive wire to bond to a respective connection point of the electronic component, which is illustrated at 906. Notably, because the collected conductive threads of the ribbon 508 have the same pitch as the connection points 412 of the electronic component 203, this process is similar to attaching standard cables. Bonding component 406 may be implemented in a variety of different ways. However, in one or more implementations, bonding component 406 is implemented as a "hand tool" which can be at least partially operated by a user.

Figure 10:
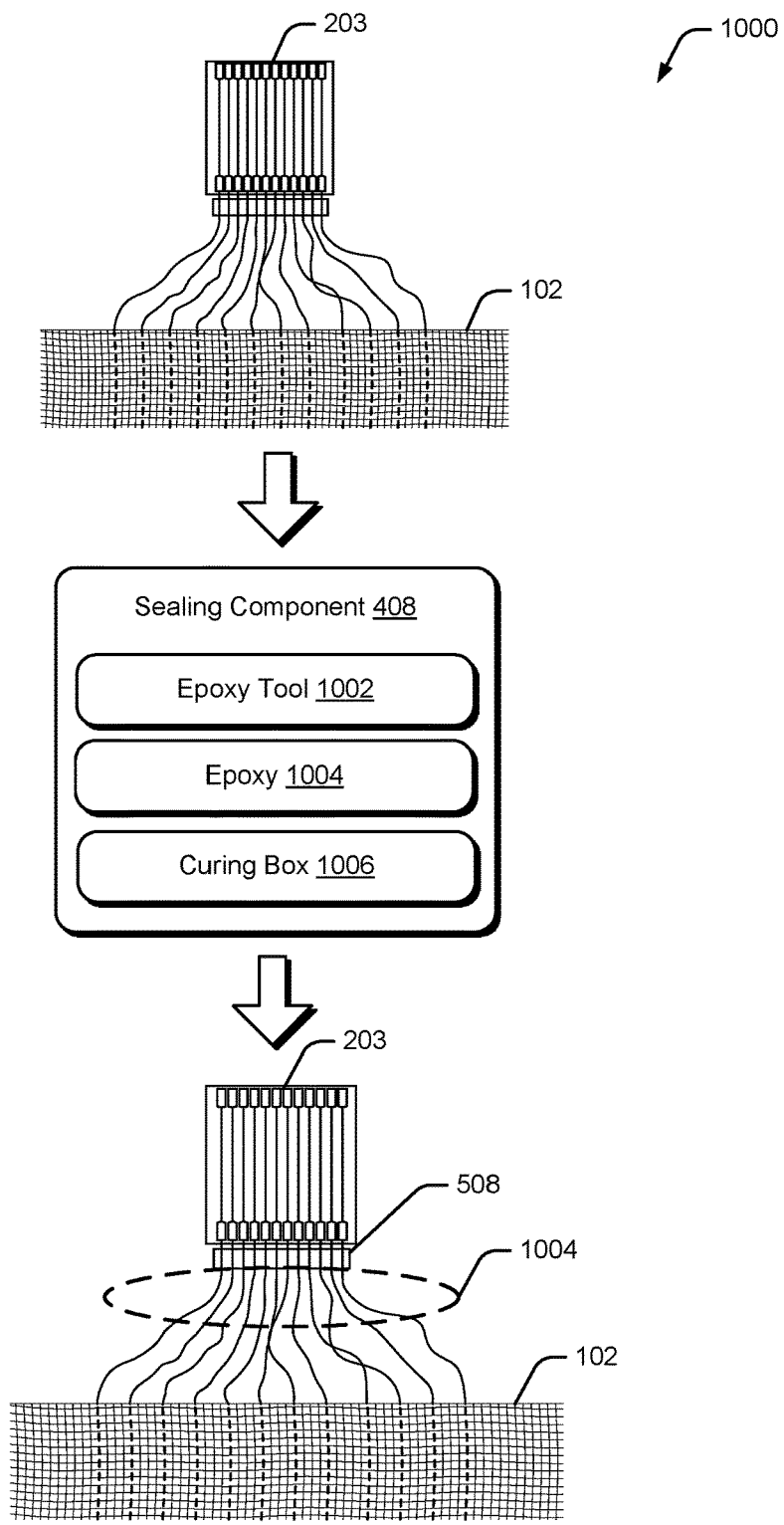
FIG. 10 illustrates a system in which the sealing component of FIG. 4 is implemented to seal the conductive threads in accordance with one or more implementations.

FIG. 10 illustrates a system 1000 in which the sealing component 408 of FIG. 4 is implemented to seal the conductive threads in accordance with one or more implementations. In this example, sealing component 408 receives electronic component 203 with bonded conductive threads 208. An epoxy tool 1002 is utilized to apply epoxy 1004 to each of the conductive threads 208.

In one or more implementations, the epoxy tool is implemented with a multi-nozzle syringe head which enables the epoxy to be simultaneously applied to each of the conductive threads 208. For example, the multi-head nozzle may be implemented with 12 nozzles to enable the epoxy to be applied to 12 conductive threads 208 at once. Alternately, the epoxy tool 1002 may be implemented with a single nozzle, in which case the epoxy muse be individually applied to each conductive thread.

Figure 11:
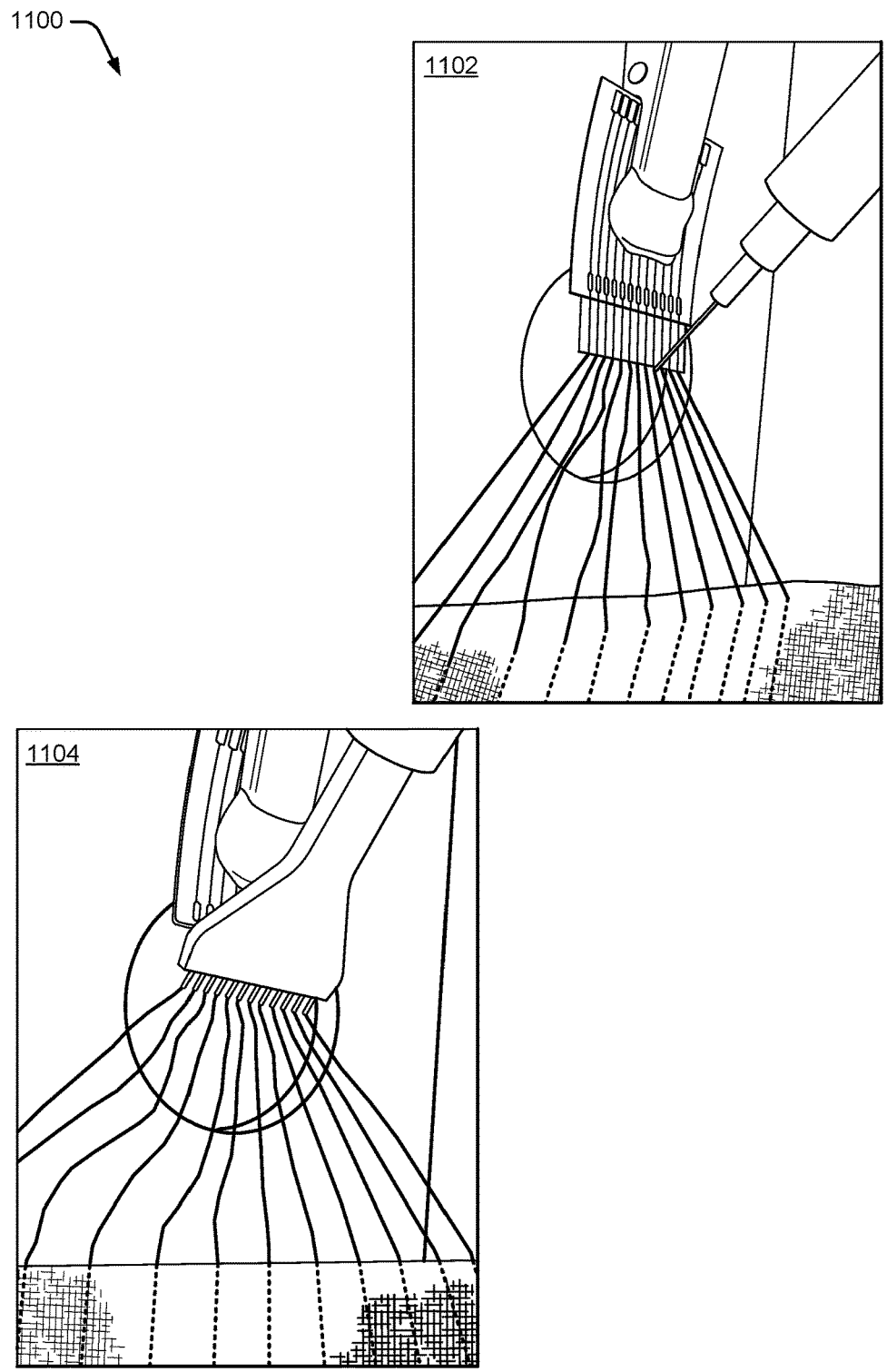
FIG. 11 illustrates an example of epoxy tools in accordance with one or more implementations.

As an example, consider FIG. 11 which illustrates an example 1100 of epoxy tools in accordance with one or more implementations. At 1102, a single-head nozzle is illustrated, and at 1104 a multi-head nozzle tool is illustrated. Notably, the epoxy 1004 is applied to the conductive threads 208 that are at the base of ribbon 508, such that the ribbon is between the applied epoxy and electronic component 203. After the epoxy 1004 is applied, the epoxy and conductive threads are cured with UV light or heat by placing the electronic component and the attached conductive threads into a curing box 1006. Doing so causes the epoxy to wick into the fiber of the conductive thread 208, which prevents liquid from being drawn up from the conductive threads 208 to the electronic component 203.

Figure 12:
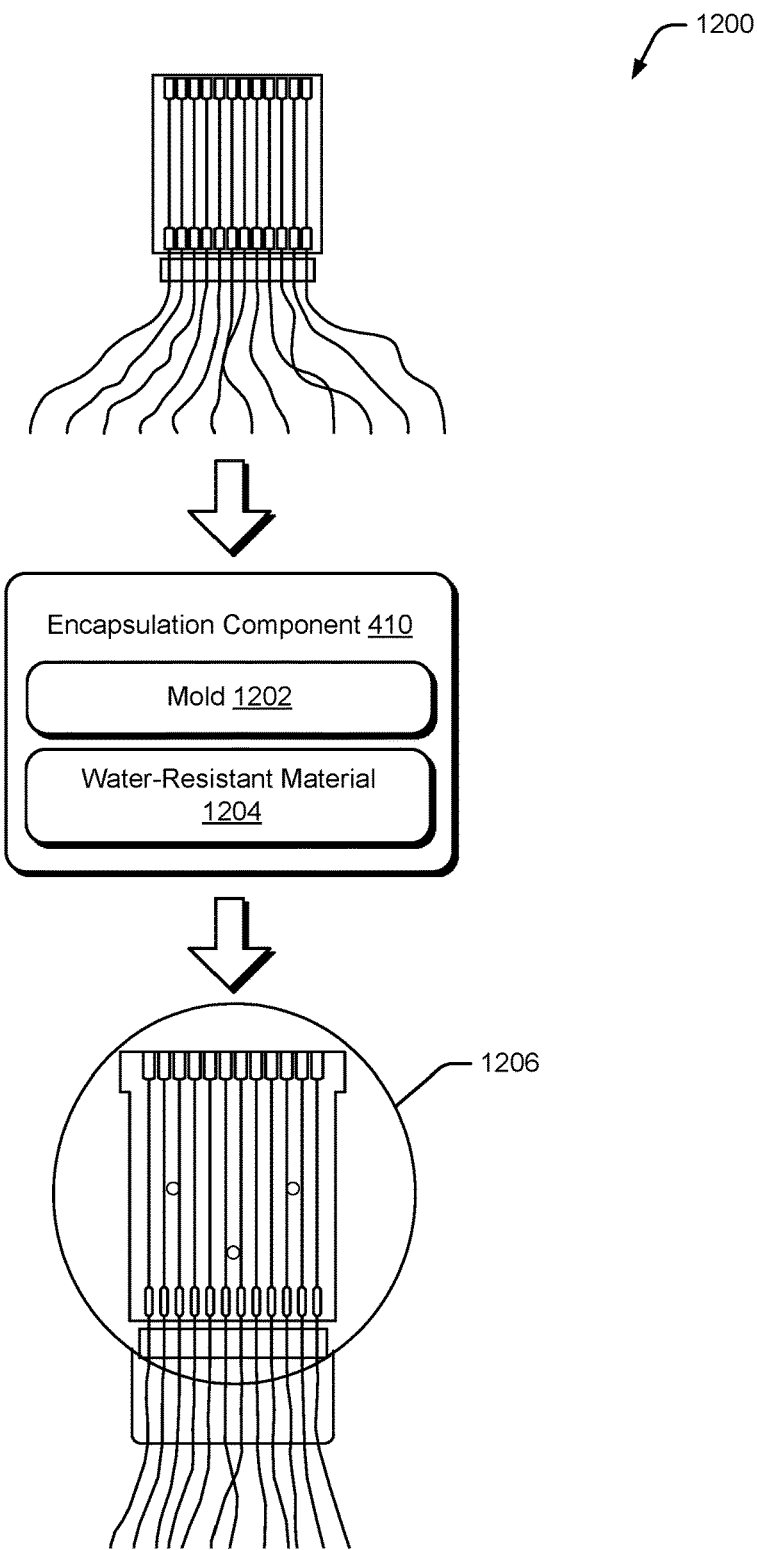
FIG. 12 illustrates a system in which the encapsulation component of FIG. 4 is implemented to encapsulate an electronic component bonded to an interactive textile.

FIG. 12 illustrates a system 1200 in which the encapsulation component 410 of FIG. 4 is implemented to encapsulate the electronic component 203 bonded to the interactive textile 102. In this example, encapsulation component 410 receives electronic component 203 with bonded conductive threads which have been sealed with epoxy, as described above.

In the encapsulation process, the electronic component 203 that is bonded to the conductive wires 306 is permanently mounted on the interactive textile 102. To protect the electronic component 203, a water-resistant enclosure (e.g., plastic or polymer) is bonded to the fabric of the interactive textile 102 such that the electronic component 203 is housed within the encapsulation.

To do so, the electronic component 203 and ribbon 508 are placed into a mold 1202. Then, a water-resistant material 1204, or other water-resistant material, is applied to the mold 1202 (e.g., using an extrusion gun) such that the water-resistant material hardens around the electronic component 203 and the ribbon 508. The electronic component 203 and ribbon 508 are then removed from the mold 1302, and the polymer hardens around the electronic component and ribbon to form an encapsulation 1206. Notably, the electronic component 203, ribbon 508, and the conductive threads proximate ribbon 508 are completely encapsulated. Furthermore, since the conductive threads at the base of ribbon 508 are sealed, water is prevented from being drawn up into the encapsulation 1206.

Example Methods

Figure 13:
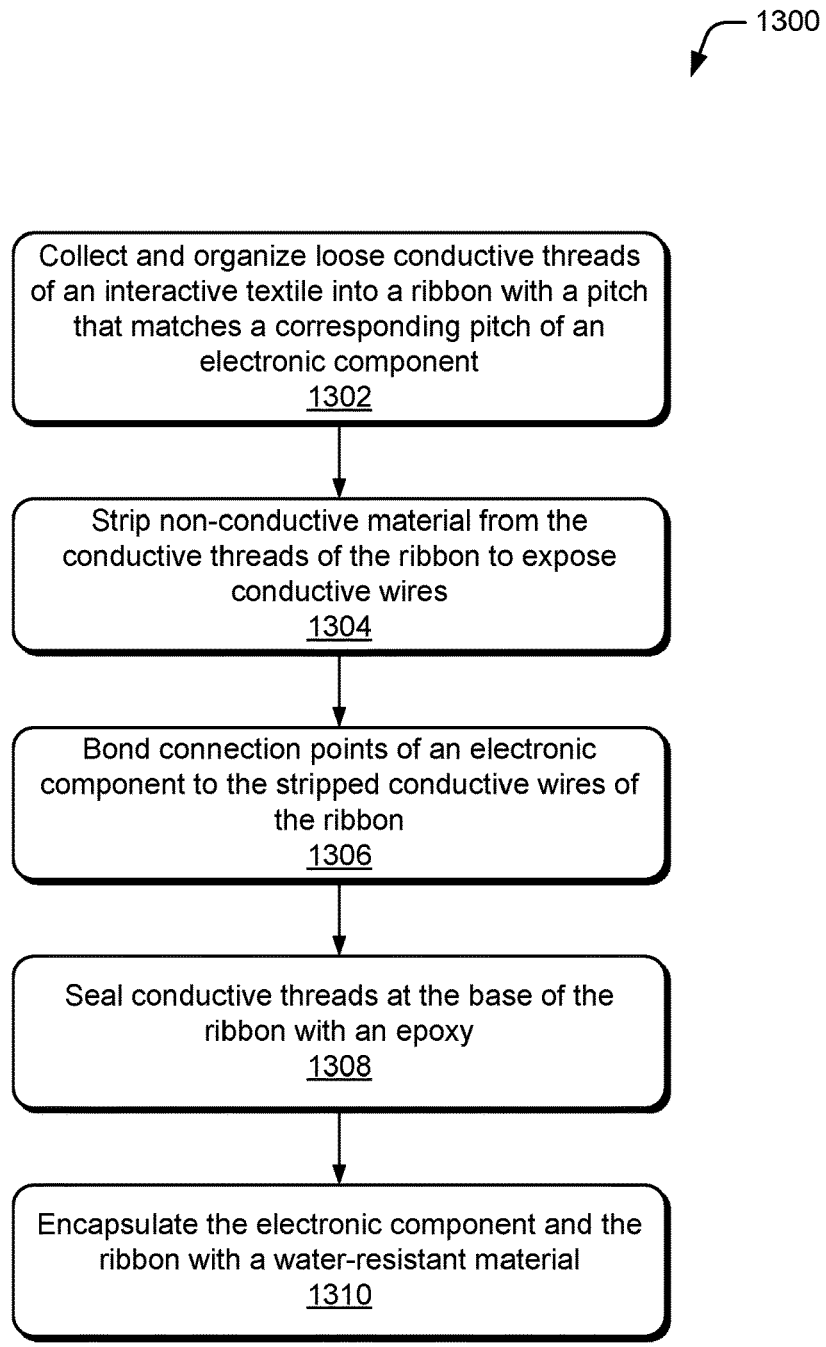
FIG. 13 illustrates an example method of connecting an electronic component to an interactive textile.

FIG. 13 illustrates an example method 1300 of connecting an electronic component to an interactive textile. This method is shown as sets of blocks that specify operations performed but are not necessarily limited to the order or combinations shown for performing the operations by the respective blocks. The techniques are not limited to performance by one entity or multiple entities operating on one device.

At 1302, loose conductive threads of an interactive textile are collected and organized into a ribbon with a pitch that matches a pitch of connection points of an electronic component. For example, ribbonization component 402 collects and organizes loose conductive threads 208 of interactive textile 102 into a ribbon 508 with a pitch that matches a pitch of connection points 412 of electronic component 203.

At 1304, non-conductive material of the conductive threads of the ribbon are stripped to expose conductive wires of the conductive threads. For example, stripping component 404 strips non-conductive material of the conductive threads 208 of ribbon 508 to expose conducive wires 306.

At 1306, the connection points of the electronic component are bonded to the exposed conductive wires of the ribbon. For example, bonding component 406 bonds connection points 412 of electronic component 203 to the exposed conductive wires 306 of ribbon 508.

At 1308, conductive threads at the base of the ribbon are sealed with an epoxy. For example, sealing component 408 seals conductive threads 208 at the base of ribbon 508 with an epoxy 1004.

At 1310, the electronic component and the ribbon are encapsulated with a water-resistant material. For example, encapsulation component 410 encapsulates the electronic component 203 and ribbon 508 with a water-resistant material, such as plastic or polymer.

Example Computing System

Figure 14:
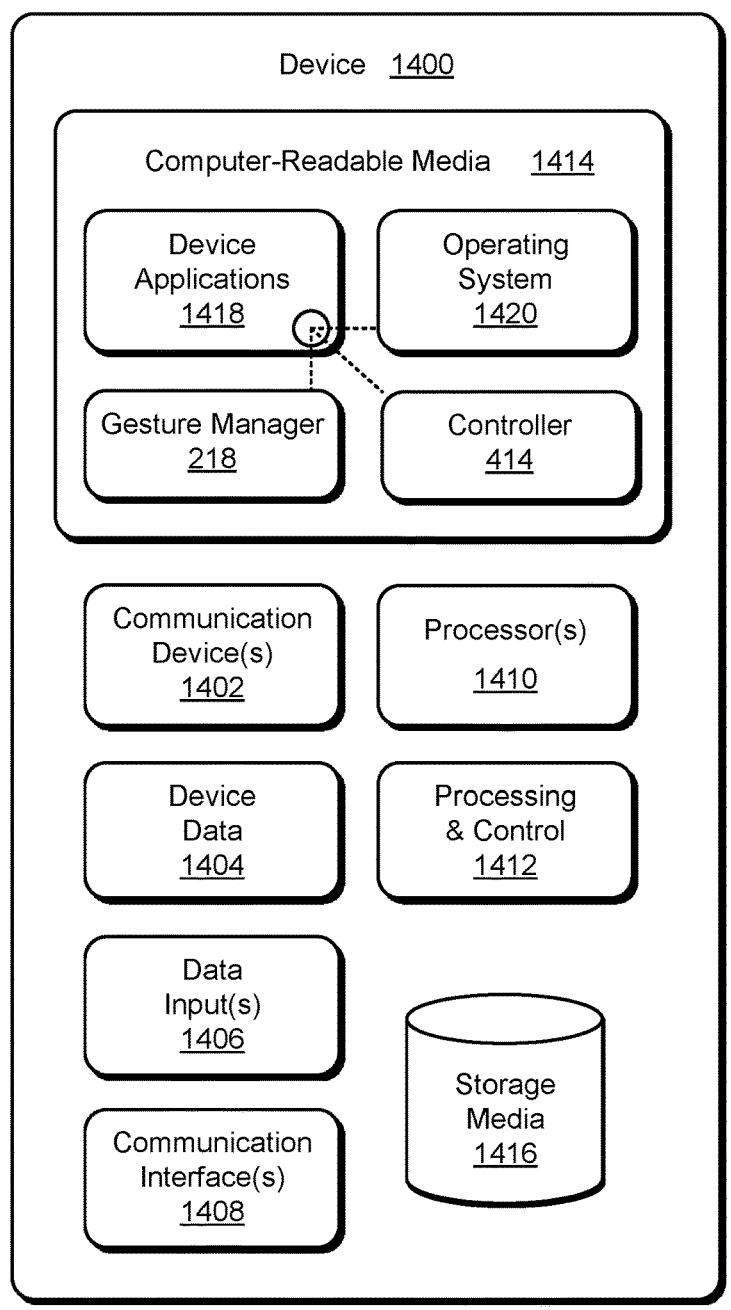
FIG. 14 illustrates various components of an example computing system that can be implemented as any type of client, server, and/or computing device as described with reference to the previous FIGS. 1-13 to implement connecting an electronic component to an interactive textile.

FIG. 14 illustrates various components of an example computing system 1400 that can be implemented as any type of client, server, and/or computing device as described with reference to the previous FIGS. 1-13 to implement connecting an electronic component to an interactive textile. In embodiments, computing system 1400 can be implemented as one or a combination of a wired and/or wireless wearable device, System-on-Chip (SoC), and/or as another type of device or portion thereof. Computing system 1400 may also be associated with a user (e.g., a person) and/or an entity that operates the device such that a device describes logical devices that include users, software, firmware, and/or a combination of devices.

Computing system 1400 includes communication devices 1402 that enable wired and/or wireless communication of device data 1404 (e.g., received data, data that is being received, data scheduled for broadcast, data packets of the data, etc.). Device data 1404 or other device content can include configuration settings of the device, media content stored on the device, and/or information associated with a user of the device. Media content stored on computing system 1400 can include any type of audio, video, and/or image data. Computing system 1400 includes one or more data inputs 1406 via which any type of data, media content, and/or inputs can be received, such as human utterances, touch data generated by interactive textile 102, user-selectable inputs (explicit or implicit), messages, music, television media content, recorded video content, and any other type of audio, video, and/or image data received from any content and/or data source.

Computing system 1400 also includes communication interfaces 1408, which can be implemented as any one or more of a serial and/or parallel interface, a wireless interface, any type of network interface, a modem, and as any other type of communication interface. Communication interfaces 1408 provide a connection and/or communication links between computing system 1400 and a communication network by which other electronic, computing, and communication devices communicate data with computing system 1400.

Computing system 1400 includes one or more processors 1410 (e.g., any of microprocessors, controllers, and the like), which process various computer-executable instructions to control the operation of computing system 1400 and to enable techniques for, or in which can be embodied, interactive textiles. Alternatively or in addition, computing system 1400 can be implemented with any one or combination of hardware, firmware, or fixed logic circuitry that is implemented in connection with processing and control circuits which are generally identified at 1412. Although not shown, computing system 1400 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Computing system 1400 also includes computer-readable media 1414, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Computing system 1400 can also include a mass storage media device 1416.

Computer-readable media 1414 provides data storage mechanisms to store device data 1404, as well as various device applications 1418 and any other types of information and/or data related to operational aspects of computing system 1400. For example, an operating system 1420 can be maintained as a computer application with computer-readable media 1414 and executed on processors 1410. Device applications 1418 may include a device manager, such as any form of a control application, software application, signal-processing and control module, code that is native to a particular device, a hardware abstraction layer for a particular device, and so on.

Device applications 1418 also include any system components, engines, or managers to implement connecting an electronic component to an interactive textile. In this example, device applications 1418 include gesture manager 218 and controller 414.

CONCLUSION

Although embodiments of connecting an electronic component to an interactive textile have been described in language specific to features and/or methods, it is to be understood that the subject of the appended claims is not necessarily limited to the specific features or methods described. Rather, the specific features and methods are disclosed as example implementations of connecting an electronic component to an interactive textile.

What is claimed is:

1. A system for connecting an electronic component to an interactive textile, the system comprising:
   a ribbonization component comprising a comb tool and a heating element, the ribbonization component configured to collect and organize loose conductive threads of the interactive textile using the comb tool and press the heating element over a film placed over the organized conductive threads in the comb tool to form a ribbon;
   a stripping component comprising a hot blade, the stripping component configured to apply the hot blade to the organized conductive threads in the comb tool to strip non-conductive material from the conductive threads to expose conductive wires of the conductive threads; and a bonding component comprising a hot bar, the bonding component configured to press the hot bar prepped with solder against the exposed conductive wires and the connection points to cause each exposed conductive wire to bond to a respective connection point of the electronic component.

2. The system of claim 1, wherein the comb tool includes openings that are spaced based on a corresponding pitch of the connection points.

3. The system of claim 1, further comprising a sealing component, the sealing component configured to apply epoxy to each of the conductive threads at the base of the ribbon and cure the epoxy with UV light or heat to seal the conductive threads at the base of the ribbon.

4. The system of claim 1, further comprising an encapsulation component configured to place the electronic component and the ribbon into a mold and apply a water resistant-material to the mold such that the water-resistant material hardens and forms an encapsulation around the electronic component and the ribbon.

5. The system of claim 3, wherein the sealing component is configured to apply the epoxy simultaneously to each of the conductive threads at the base of the ribbon using a multi-head nozzle.

6. The system of claim 3, wherein the sealing component is configured to apply the epoxy individually to each of the conductive threads at the base of the ribbon using a single-head nozzle.

7. The system of claim 1, wherein a pitch of the comb tool is mechanically adjustable to enable the pitch of the comb tool to be adjusted to correspond to a pitch of the connection points of the electronic component.

8. The system of claim 1, wherein the hot blade is configured to melt or burn the non-conductive material from the conductive threads of the ribbon without melting or burning the conductive wires of the conductive threads.

9. The system of claim 1, wherein the bonding component is further configured to, prior to pressing the hot bar against the exposed conductive wires, align the exposed conductive wires with the connection points of the electronic component.

10. The system of claim 1, wherein the electronic component comprises a flexible circuit board.

11. A method for connecting an electronic component to an interactive textile, the method comprising:
collecting and organizing loose conductive threads of the interactive textile using a comb tool;
placing a film over the organized conductive threads within the comb tool;
pressing a heating element over the film to secure the organized conductive threads and form a ribbon;
applying a hot blade to the organized conductive threads in the comb tool to strip non-conductive material from the conductive threads and expose conductive wires of the conductive threads; and
pressing a hot bar prepped with solder against the exposed conductive wires and connection points of the electronic component to cause each exposed conductive wire to bond to a respective connection point of the electronic component.

12. The method of claim 11, wherein the comb tool includes openings that are spaced based on a corresponding pitch of the connection points.

13. The method of claim 11, wherein the pitch of the comb tool is mechanically adjustable.

14. The method of claim 11, further comprising:
applying, using a sealing component, epoxy to each of the conductive threads at a base of the ribbon; and
curing, using the sealing component, the epoxy with ultraviolet light or heat to seal the conductive threads at the base of the ribbon.

15. The method of claim 14, wherein the applying the epoxy includes applying the epoxy simultaneously to each of the conductive threads at the base of the ribbon using a multi-head nozzle.

16. The method of claim 14, wherein the applying the epoxy includes applying individually to each of the conductive threads at the base of the ribbon using a single-head nozzle.

17. The method of claim 11, further comprising:
placing, by an encapsulation component, the electronic component and the ribbon into a mold; and
applying, by the encapsulation component, a water-resistant material to the mold such that the water-resistant material hardens and forms an encapsulation around the electronic component and the ribbon.

18. The method of claim 17, wherein the water-resistant material comprises a plastic or polymer.

19. The method of claim 11, wherein applying the hot blade comprises melting or burning, with the hot blade, the non-conductive material from the conductive threads of the ribbon without melting or burning the conductive wires of the conductive threads.

20. The method of claim 11, further comprising, prior to pressing the hot bar against the exposed conductive wires, aligning the exposed conductive wires with the connection points of the electronic component.

* * * * *